US010950759B2

(12) United States Patent
Kobayakawa

(10) Patent No.: US 10,950,759 B2
(45) Date of Patent: Mar. 16, 2021

(54) LED MODULE

(71) Applicant: ROHM CO., LTD., Kyoto (JP)

(72) Inventor: Masahiko Kobayakawa, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/926,940

(22) Filed: Jul. 13, 2020

(65) Prior Publication Data

US 2020/0343415 A1 Oct. 29, 2020

Related U.S. Application Data

(63) Continuation of application No. 16/040,082, filed on Jul. 19, 2018, now Pat. No. 10,749,079, which is a continuation of application No. 13/822,495, filed as application No. PCT/JP2011/073386 on Oct. 12, 2011, now Pat. No. 10,050,179.

(30) Foreign Application Priority Data

Oct. 12, 2010 (JP) ................................. 2010-229924

(51) Int. Cl.
*H01L 33/04* (2010.01)
*H01L 33/44* (2010.01)
*H01L 33/60* (2010.01)
*H01L 33/46* (2010.01)

(52) U.S. Cl.
CPC .............. *H01L 33/44* (2013.01); *H01L 33/60* (2013.01); *H01L 33/46* (2013.01); *H01L 2224/48227* (2013.01); *H01L 2224/48257* (2013.01); *H01L 2224/73265* (2013.01); *H01L 2924/3025* (2013.01)

(58) Field of Classification Search
CPC .............................................. H01L 33/00–648
See application file for complete search history.

(56) References Cited

U.S. PATENT DOCUMENTS

| 5,689,106 | A | 11/1997 | Dahlin |
| 6,303,998 | B1 | 10/2001 | Murayama |
| 6,858,456 | B2 | 2/2005 | Noguchi et al. |
| 7,323,704 | B2 | 1/2008 | Tai |

(Continued)

FOREIGN PATENT DOCUMENTS

| JP | 2004-55632 A | 2/2004 |
| JP | 2004-119743 A | 4/2004 |

(Continued)

OTHER PUBLICATIONS

Office Action issued in corresponding Japanese Patent Application 2012-538687, dated Dec. 8, 2015 (4 pages).

*Primary Examiner* — Sean P Gramling
(74) *Attorney, Agent, or Firm* — Hamre, Schumann, Mueller & Larson, P.C.

(57) ABSTRACT

An LED module 101 is provided with an LED chip 200 that includes a sub-mount substrate 210 made of Si and a semiconductor layer 220 laminated on the sub-mount substrate 210. The module also includes white resin 280 that does not transmit light from the semiconductor layer 220 and that covers at least part of a side of the sub-mount substrate 210, where the side is connected to the surface on which the semiconductor layer 220 is laminated. These arrangements enhance the brightness of the LED module 101.

20 Claims, 18 Drawing Sheets

(56) References Cited

U.S. PATENT DOCUMENTS

| | | |
|---|---|---|
| 7,462,871 B2 | 12/2008 | Han et al. |
| 7,709,854 B2 | 5/2010 | Bando et al. |
| 7,763,905 B2 | 7/2010 | Kadotani et al. |
| 2002/0121645 A1 | 9/2002 | Yasukawa et al. |
| 2004/0089898 A1 | 5/2004 | Ruhnau et al. |
| 2008/0179617 A1 | 7/2008 | Kadotani et al. |
| 2009/0284130 A1 | 11/2009 | Tsuji et al. |
| 2012/0313131 A1* | 12/2012 | Oda .................. H01L 23/3121 257/98 |

FOREIGN PATENT DOCUMENTS

| | | | |
|---|---|---|---|
| JP | 2005-101203 A | 4/2005 | |
| JP | 2005-136379 A | 5/2005 | |
| JP | 2007-43175 A | 2/2007 | |
| JP | 2007-194525 A | 8/2007 | |
| JP | 2008-112966 A | 5/2008 | |
| JP | 2008-199000 A | 8/2008 | |
| JP | 2009-260073 A | 11/2009 | |
| JP | 2010-206138 A | 9/2010 | |
| WO | WO-2011122665 A1 * | 10/2011 | ......... H01L 23/3121 |

* cited by examiner

LED MODULE

TECHNICAL FIELD

The present invention relates to an LED module including an LED chip as the light source.

BACKGROUND ART

FIG. 33 shows an example of conventional LED module (see Patent Document 1, for example). The LED module 900 shown in the figure includes an LED chip 902 mounted on a substrate 901. The LED chip 902 is surrounded by a reflector 905 in the form of a frame. The space surrounded by the reflector 905 is filled with sealing resin 906. The LED chip 902 includes a sub-mount substrate 903 made of Si and a semiconductor layer 904 laminated on the sub-mount substrate 903. The semiconductor layer 904 is electrically connected to the substrate 901 via the sub-mount substrate 903.

The sub-mount substrate 903 is made of Si, which may absorb light of e.g. blue emitted from the semiconductor layer 904. Thus, some of the light, emitted from the semiconductor layer 904 and traveling toward the sub-mount substrate 903, will be absorbed by the sub-mount substrate 903. Unfavorably, this hinders enhancement in brightness of the LED module 900.

Patent Document 1: JP-A-2004-119743

SUMMARY OF INVENTION

Technical Problem

The present invention has been conceived under the circumstances described above. It is therefore an object of the present invention to provide an LED module that enhances brightness.

Solution to Problem

According to an embodiment of the present invention, there is provided an LED module comprising: at least one LED chip including a sub-mount substrate and a semiconductor layer laminated on the sub-mount substrate, the sub-mount substrate being made of Si; and opaque resin that does not transmit light from the semiconductor layer. The sub-mount substrate includes a side connected to a surface on which the semiconductor layer is laminated, and the opaque resin covers at least part of the side of the sub-mount substrate.

Preferably, the opaque resin is white.

Preferably, the opaque resin covers the entirety of the side of the sub-mount substrate while exposing the semiconductor layer.

Preferably, the sub-mount substrate is formed with a Zener diode for preventing an excessive reverse voltage from being applied to the semiconductor layer.

Preferably, the semiconductor layer is configured to emit blue light or green light.

Preferably, the LED module further comprises a base substrate including a base member and a wiring pattern, where the LED chip is mounted on the base substrate.

Preferably, the LED module further comprises two wires connecting the sub-mount substrate to the wiring pattern, where the opaque resin is provided in a region that extends from the side of the sub-mount substrate and does not reach a point where the wires are bonded to the wiring pattern.

Preferably, the LED module further comprises a wire connecting the sub-mount substrate to the wiring pattern, where the sub-mount substrate includes another surface opposite from the surface on which the semiconductor layer is laminated, and the another surface is electrically connected to the wiring pattern. The opaque resin is provided in a region that extends from the side of the sub-mount substrate and does not reach a point where the wire is bonded to the wiring pattern.

Preferably, the sub-mount substrate includes another surface opposite from the surface on which the semiconductor layer is laminated. The another surface is provided with two electrode pads, and the electrode pads are electrically connected to the wiring pattern.

Preferably, the LED module further comprises: a reflector attached to the base substrate and including a reflective surface surrounding the LED chip; and sealing resin that covers the LED chip and transmits light from the LED chip.

Preferably, the LED module further comprises sealing resin provided on the base substrate, where the sealing resin covers the LED chip and transmits light from the LED chip.

Preferably, the LED module further comprises a plurality of leads, where the LED chip is mounted on one of the leads.

Preferably, the LED module further comprises two wires connecting the sub-mount substrate to the leads, where the opaque resin is provided in a region that extends from the side of the sub-mount substrate and does not reach a point where the wires are bonded to the leads.

Preferably, the LED module further comprises a wire connecting the sub-mount substrate to the leads, where the sub-mount substrate includes another surface opposite from the surface on which the semiconductor layer is laminated, and the another surface is electrically connected to one of the leads. The opaque resin is provided in a region that extends from the side of the sub-mount substrate and does not reach a point where the wire is bonded to the leads.

Preferably, the sub-mount substrate includes another surface opposite from the surface on which the semiconductor layer is laminated, and the another surface is provided with two electrode pads electrically connected to the leads.

Preferably, the LED module further comprises: a reflector covering at least part of each of the leads and including a reflective surface surrounding the LED chip; and sealing resin that covers the LED chip and transmits light from the LED chip.

Preferably, the LED module further comprises sealing resin that covers the LED chip and at least part of each of the leads, where the sealing resin transmits light from the LED chip.

Preferably, the LED module further comprises two leads, where one of the leads includes an end at which the LED chip is mounted, and the other one of the leads includes an end to which a wire for electrical connection to the sub-mount substrate is bonded. The LED module further comprises sealing resin that covers the ends of the two leads and the LED chip, and transmits light from the LED chip. The sealing resin includes a lens for enhancing directivity of the light from the LED chip.

Preferably, the end of one of the leads is formed with a cup including a bottom surface on which the LED chip is mounted, and the bottom surface has a portion not covered with the LED chip but covered with the opaque resin.

Preferably, the LED module is provided with two of LED chip mentioned above, and further comprises an additional LED chip. The additional LED chip includes a first surface and a second surface opposite from the first surface, where the first surface is configured to serve as an electrode surface for electrical connection, and the second surface is connected to a wire. The opaque resin is arranged to expose the additional LED chip.

Preferably, one of the two LED chips emits blue light, and the other of the two LED chips emits green light. The additional LED chip emits red light.

Other features and advantages of the present invention will become more apparent from detailed description given below with reference to the accompanying drawings.

MODE FOR CARRYING OUT INVENTION

Figure 1:
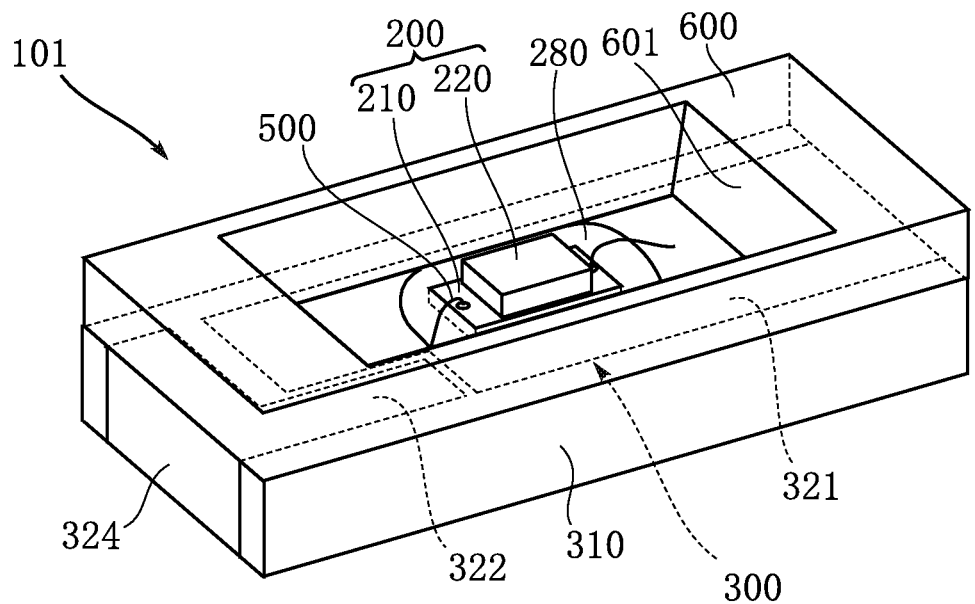
FIG. 1 is a perspective view of an LED module according to a first embodiment of the present invention.
Figure 2:
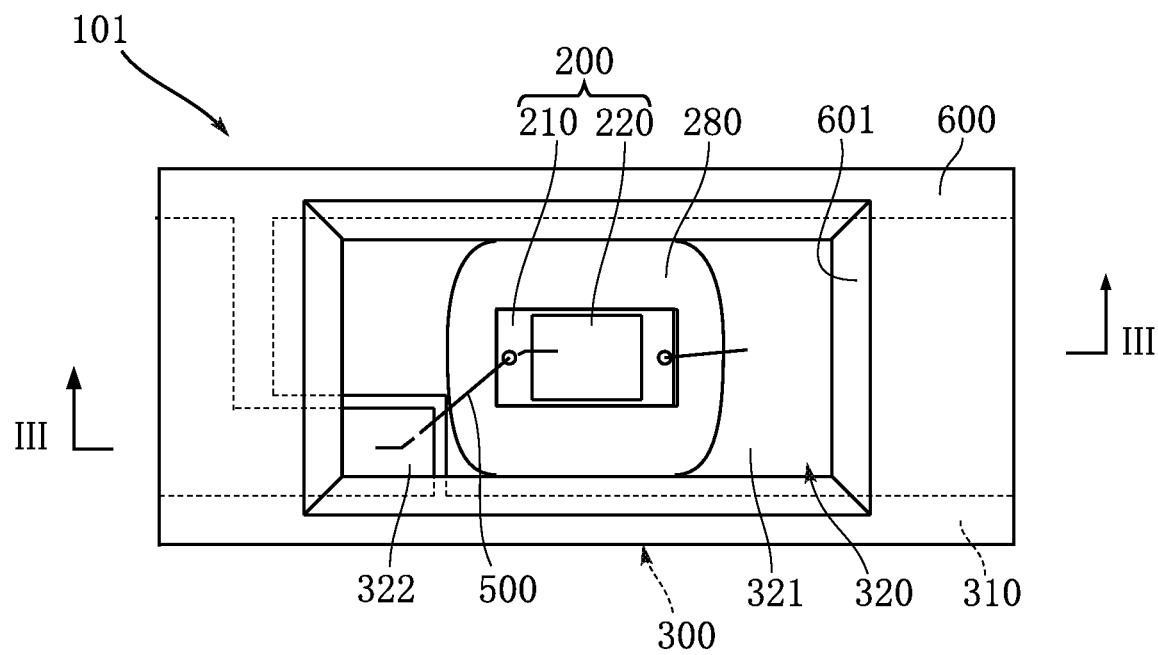
FIG. 2 is a plan view of the LED module shown in FIG. 1.
Figure 3:
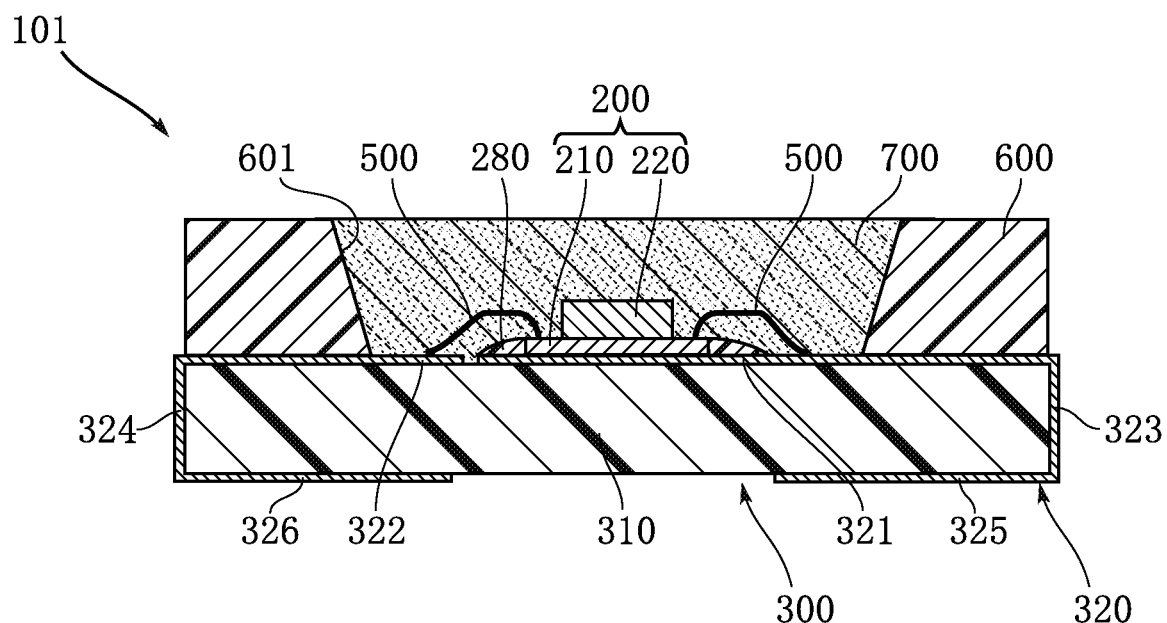
FIG. 3 is a sectional view taken along lines III-III in FIG. 2.

Preferred embodiments of the present invention are described below with reference to the accompanying drawings.

FIGS. 1-4 show an LED module according to a first embodiment of the present invention. The LED module 101 of this embodiment includes a base substrate 300, an LED chip 200, two wires 500, white resin 280, a reflector 600 and sealing resin 700. For easier understanding, the sealing resin 700 is not depicted in FIGS. 1 and 2.

The base substrate 300 includes a base member 310 and a wiring pattern 320 formed on the base member 310. The base member 310 is rectangular and made of e.g. glass-fiber-reinforced epoxy resin. The wiring pattern 320 is made of a metal such as Cu or Ag and includes bonding portions 321 and 322, turn portions 323 and 324, and mounting terminals 325 and 326. The bonding portions 321 and 322 are provided on the upper surface of the base member 310. The turn portions 323 and 324 are provided on the opposite side surfaces of the base member 310 and connected to the bonding portions 321 and 322. The mounting terminals 325 and 326 are provided on the lower surface of the base member 310 and connected to the turn portions 323 and 324. The mounting terminals 325 and 326 are used for mounting the LED module 101 to e.g. a circuit board.

Figure 4:
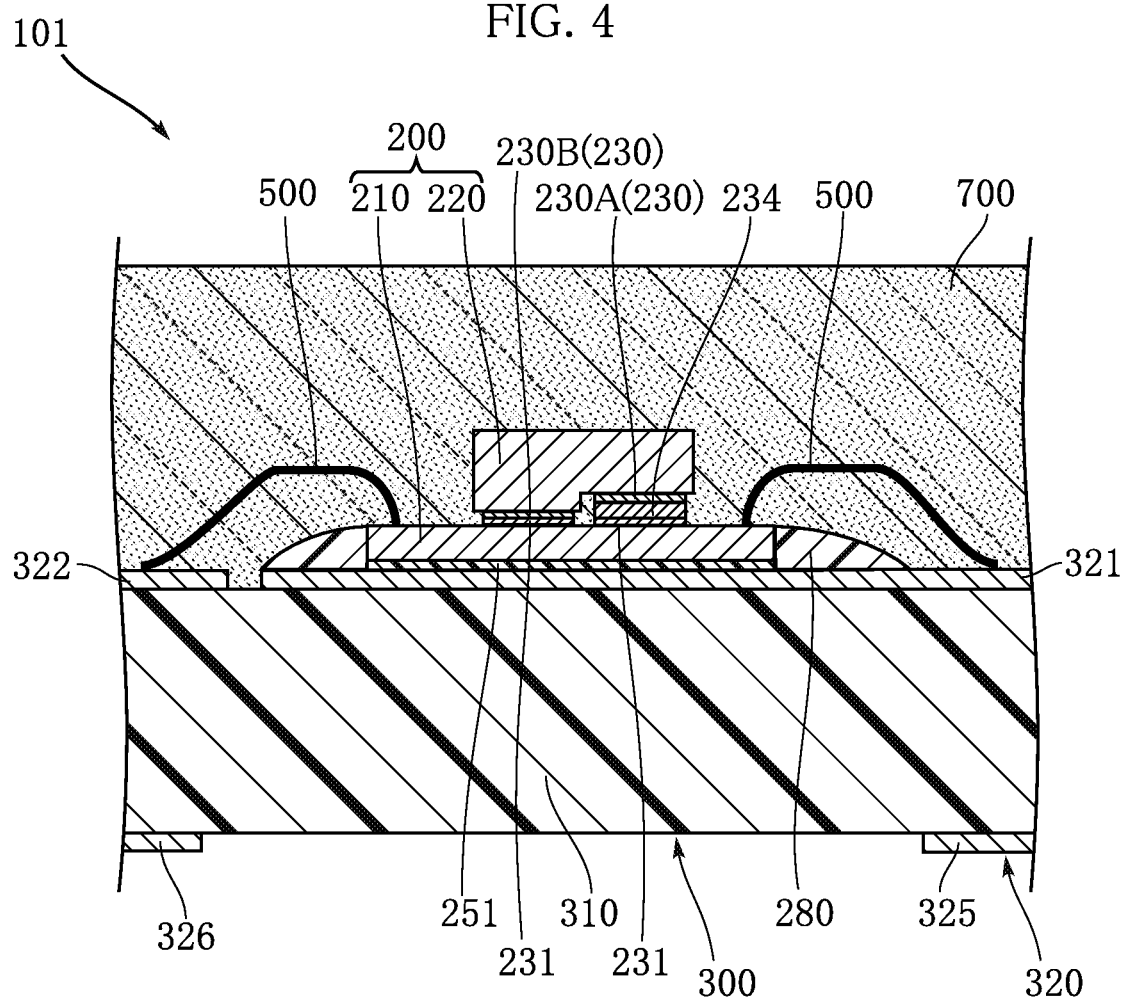
FIG. 4 is a schematic enlarged sectional view of the LED module shown in FIG. 1.

The LED chip 200 includes a sub-mount substrate 210 made of Si, and a semiconductor layer 220 made up of an n-type semiconductor layer of e.g. GaN-based semiconductor, an active layer and a p-type semiconductor layer which are arranged one on top of another. For example, the LED chip emits blue light. As shown in FIG. 4, the semiconductor layer 220 is provided with two electrode pads 230 (230A, 230B) on the sub-mount substrate 210 side. These electrode pads 230 are bonded to the wiring pattern (not shown) formed on the sub-mount substrate 210 via conductive paste 231 or a bump 234. The sub-mount substrate 210 is bonded to the bonding portion 321 via insulating paste 251. The sub-mount substrate 210 is provided with two electrodes (not shown). To each of these electrodes is bonded an end of one of the two wires 500, and the LED chip 200 is configured as a two-wire type. The other end of one wire 500 is bonded to the bonding portion 321, whereas the other end of the other wire 500 is bonded to the bonding portion 322. The sub-mount substrate 210 incorporates a Zener diode (not shown) for preventing an excessive reverse voltage from being applied to the semiconductor layer 220.

The white resin 280 is made of a white resin material that does not transmit the light from the LED chip 200 and an example of the opaque resin of the present invention. The white resin 280 covers all the side surfaces of the sub-mount substrate 210. The semiconductor layer 220 is not covered with the white resin 280. As will be understood from FIGS. 2-4, the white resin 280 surrounds the LED chip 200 as viewed in plan, and the outer edge of the white resin is slightly retreated toward the LED chip 200 from the point where each of the wires 500 is bonded to the bonding portion 321 or 322. Thus, the wires 500 are not covered with the white resin 280.

The reflector 600 is made of e.g. white resin and in the form of a frame surrounding the LED chip 200. The reflector 600 has a reflective surface 601. The reflective surface 601 surrounds the LED chip 200. In this embodiment, the reflective surface 601 is inclined to become away from the LED chip 200 in a direction perpendicular to the thickness direction of the substrate 300 as proceeding away from the substrate 300 in the thickness direction.

The sealing resin 700 covers the LED chip 200 and fills the space surrounded by the reflective surface 601. The sealing resin 700 is made of e.g. an epoxy resin in which a fluorescent material is mixed. For instance, the fluorescent material emits yellow light due to excitation by blue light emitted from the semiconductor layer 220 of the LED chip 200. The blue light and the yellow light are mixed so that white light is emitted from the LED module 101. As for the fluorescent material, use may be made of a material that emits red light or a material that emits green light due to excitation by blue light.

The LED module 101 can be made as follows. First, a semiconductor layer 220 is bonded to a sub-mount substrate 210. Then, a reflector 600 is formed on the substrate 300. Then, an LED chip 200 is mounted on the substrate 300. Subsequently, wires 500 are bonded to the LED chip 200. Then, white resin 280 is formed by applying a liquid white resin material. Then, sealing resin 700 is formed, whereby the LED module 101 is completed. Note that the white resin 280 may be formed before the wires 500 are bonded. Alternatively, an insulating resin material in a liquid state may be applied onto the bonding portion 321 at a region where the LED chip 200 is to be bonded, and a white resin material may be applied around the region, and then the LED chip 200 may be mounted.

Advantages of the LED module 101 are described below.

According to this embodiment, portions of the light emitted from the semiconductor layer 220 which travel toward the side surfaces of the sub-mount substrate 210 are blocked by the white resin 280. Thus, these portions of light are not absorbed by the sub-mount substrate 210. The white resin 280, having a higher reflectivity than Si, properly reflects the light from the semiconductor layer 220. Thus, a large amount of the light emitted from the LED chip 200 can be guided to the outside through the sealing resin 700, whereby brightness of the LED module 101 is enhanced.

Since a Zener diode is incorporated in the sub-mount substrate 210, application of excessive reverse voltage to the semiconductor layer 220 is prevented. In particular, the semiconductor layer 220 that emits blue light is generally made of a GaN-based semiconductor and easily damaged by the application of a reverse voltage. According to this embodiment, the LED chip 200 that emits blue light is properly protected.

The provision of the reflector 600 having a reflective surface 601 allows the region directly above the LED module 101 to be illuminated brightly.

FIGS. 5-32 show other embodiments of the present invention. In these figures, the elements that are identical or similar to those of the foregoing embodiments are designated by the same reference signs as those used for the foregoing embodiment.

Figure 5:
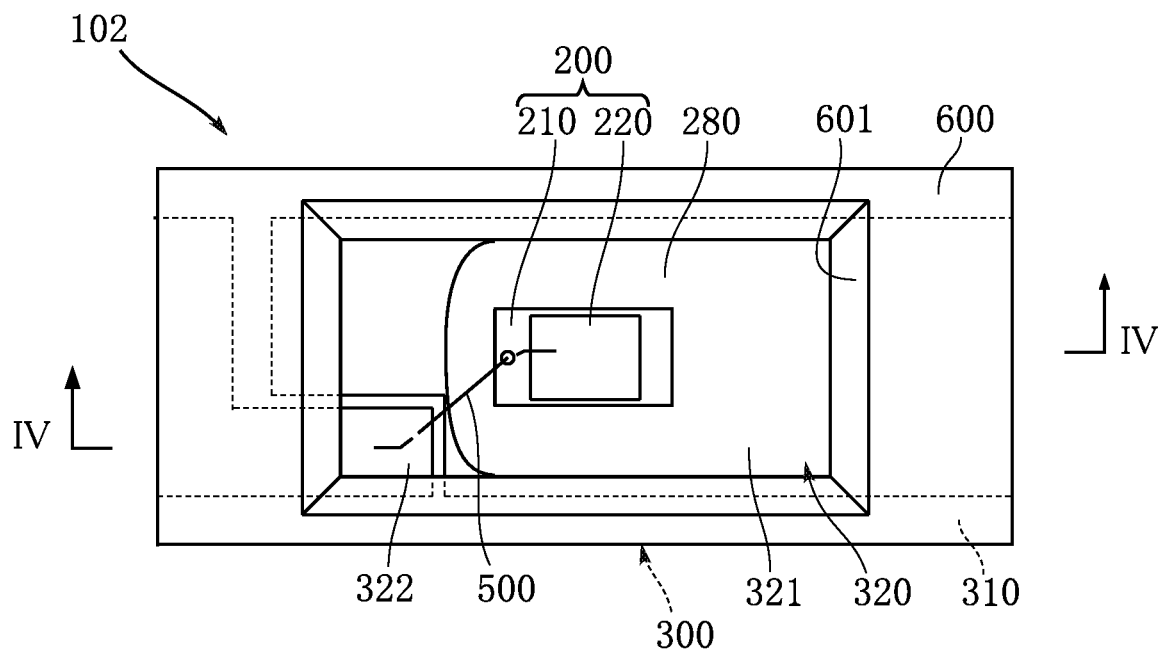
FIG. 5 is a plan view of an LED module according to a second embodiment of the present invention.
Figure 6:
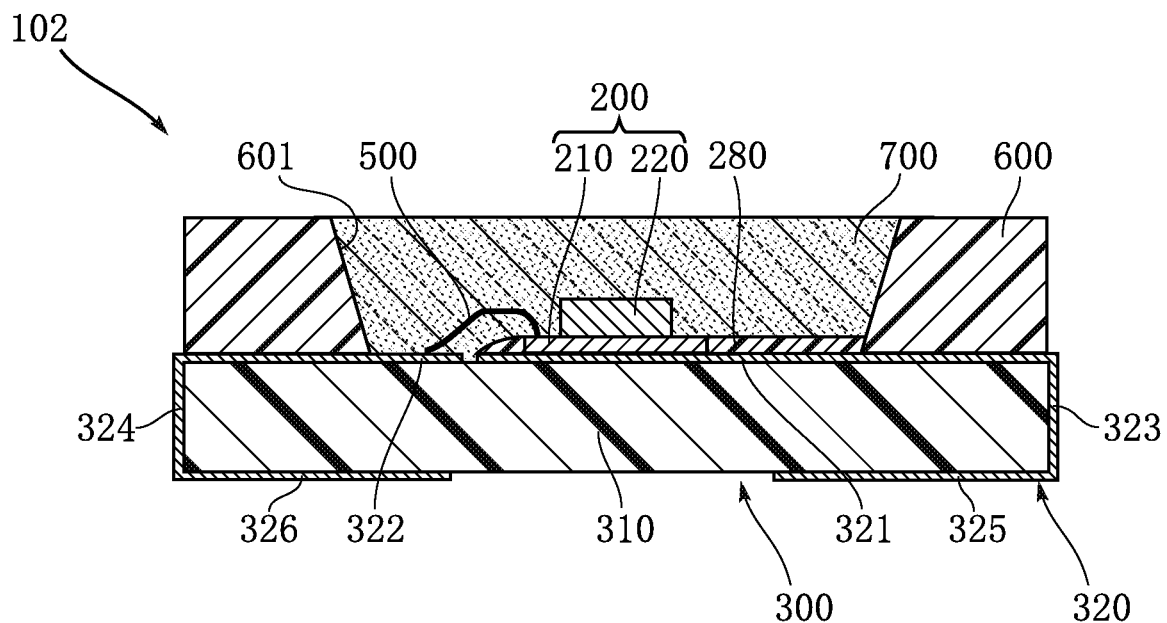
FIG. 6 is a sectional view taken along lines IV-IV in FIG. 5.
Figure 7:
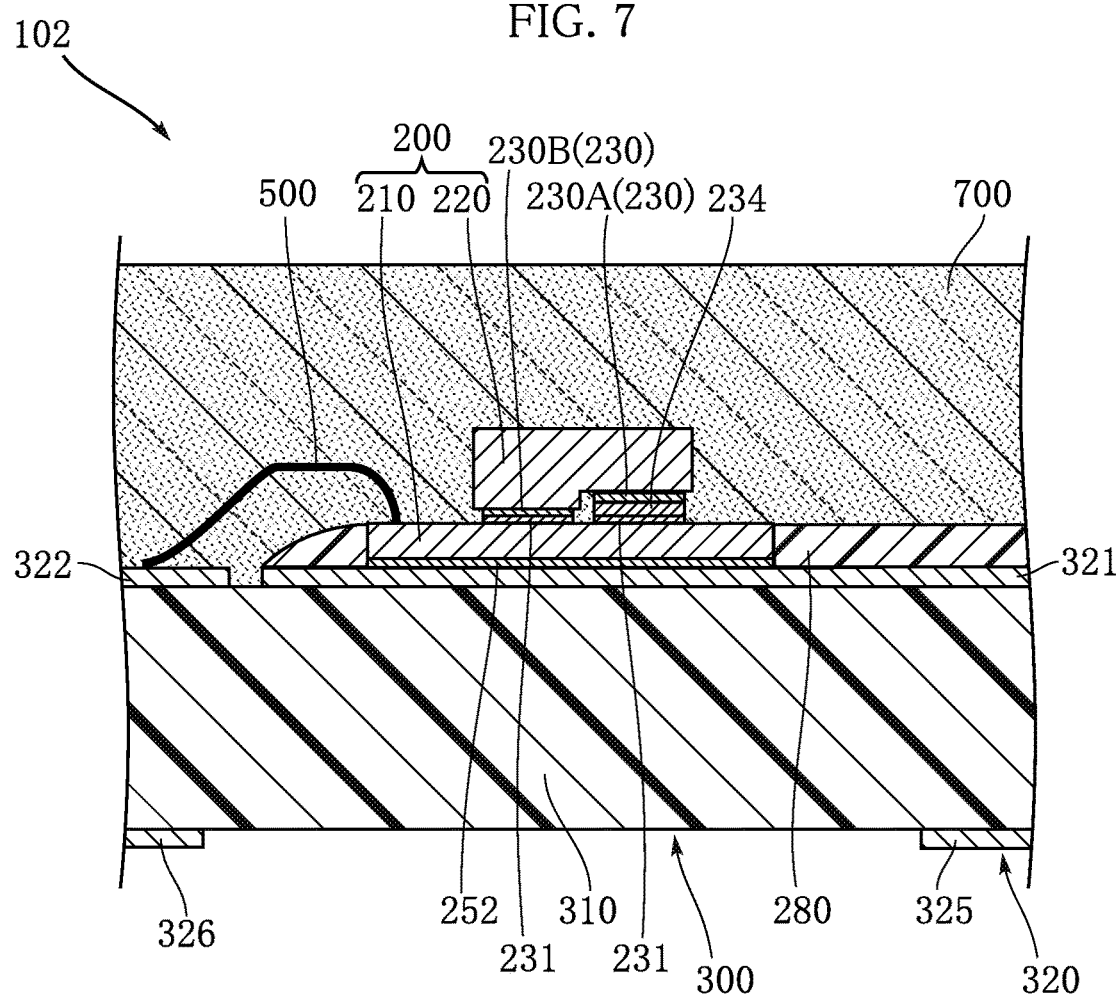
FIG. 7 is a schematic enlarged sectional view of the LED module shown in FIG. 5.

FIGS. 5-7 show an LED module according to a second embodiment of the present invention. The LED module 102 of this embodiment differs from the above-described LED module 101 in structure of the LED chip 200 and area where the white resin 280 is provided.

As shown in FIG. 7, in this embodiment, only a single wire 500 is bonded to the sub-mount substrate 210 of the LED chip 200. In this way, the sub-mount substrate 210 is configured as a single-wire type. The wire 500 is connected to the bonding portion 322. The sub-mount substrate 210 has an electrode, not shown, on its lower surface. This electrode is bonded and electrically connected to the bonding portion 321 via conductive paste 252.

As shown in FIGS. 5-7, the left portion in the figure of the outer edge of the white resin 280 is positioned between the sub-mount substrate 210 and the point where the wire 500 is bonded to the bonding portion 322. Other portions of the outer edge of the white resin 280 reach the reflective surface 601 of the reflector 600. Thus, in FIG. 5, the regions extending from the LED chip 200 toward the reflective surface 601 in the upward, downward or rightward direction in the figure are covered with the white resin 280.

This embodiment also assures enhancement of the brightness of the LED module 102. Increasing the area of the white resin 280 leads to further enhancement of the brightness of the LED module 102.

Figure 8:
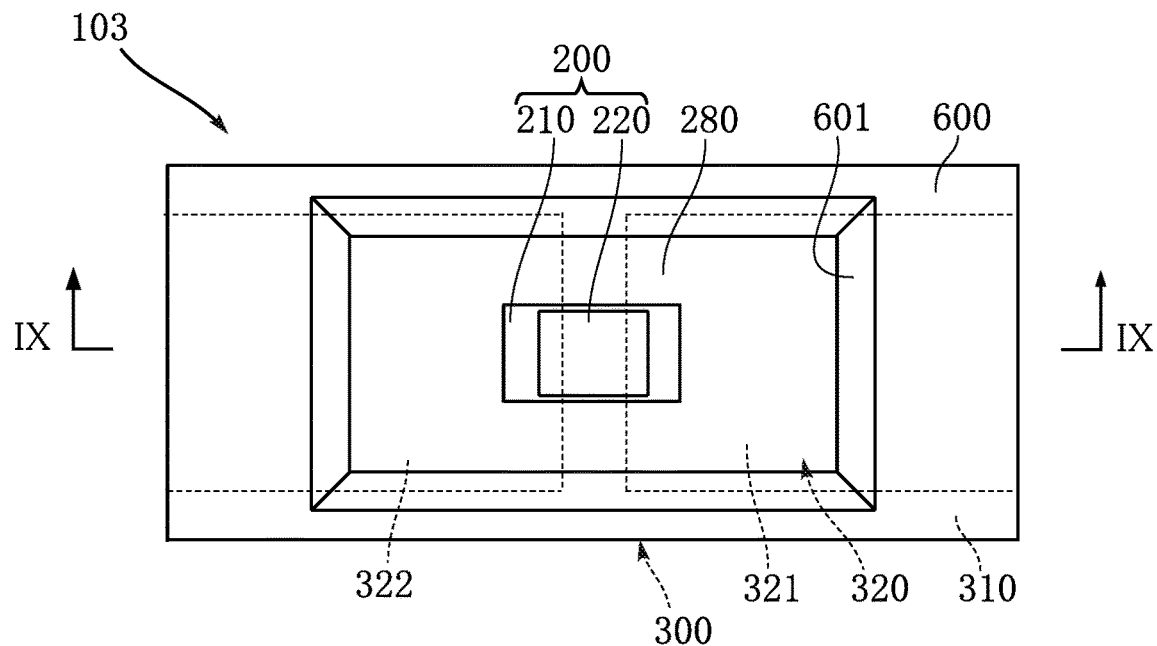
FIG. 8 is a plan view of an LED module according to a third embodiment of the present invention.
Figure 9:
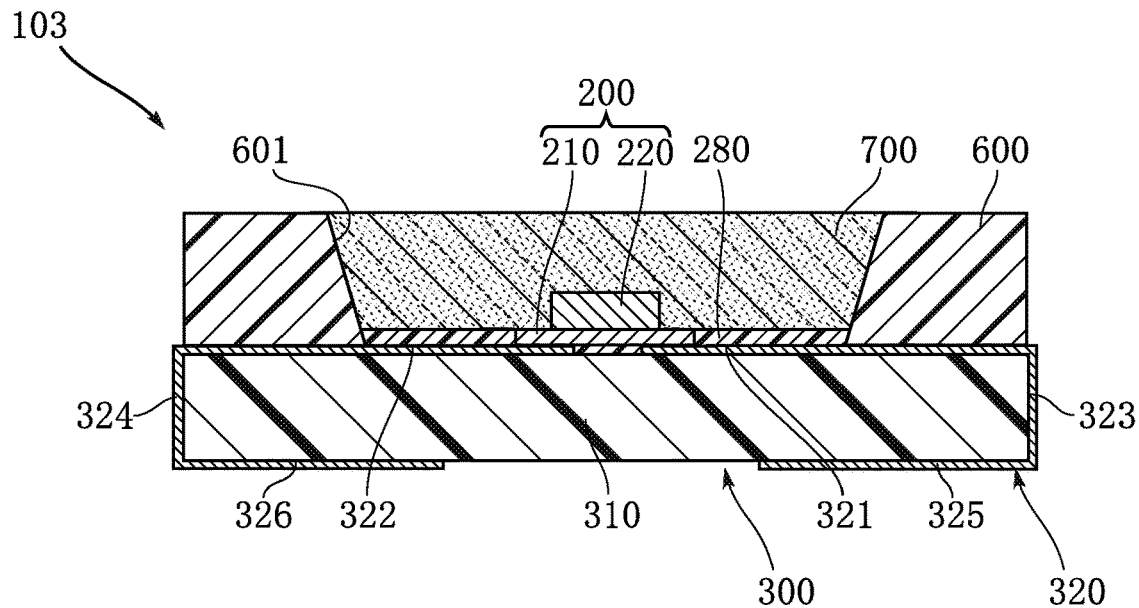
FIG. 9 is a sectional view taken along lines IX-IX in FIG. 8.
Figure 10:
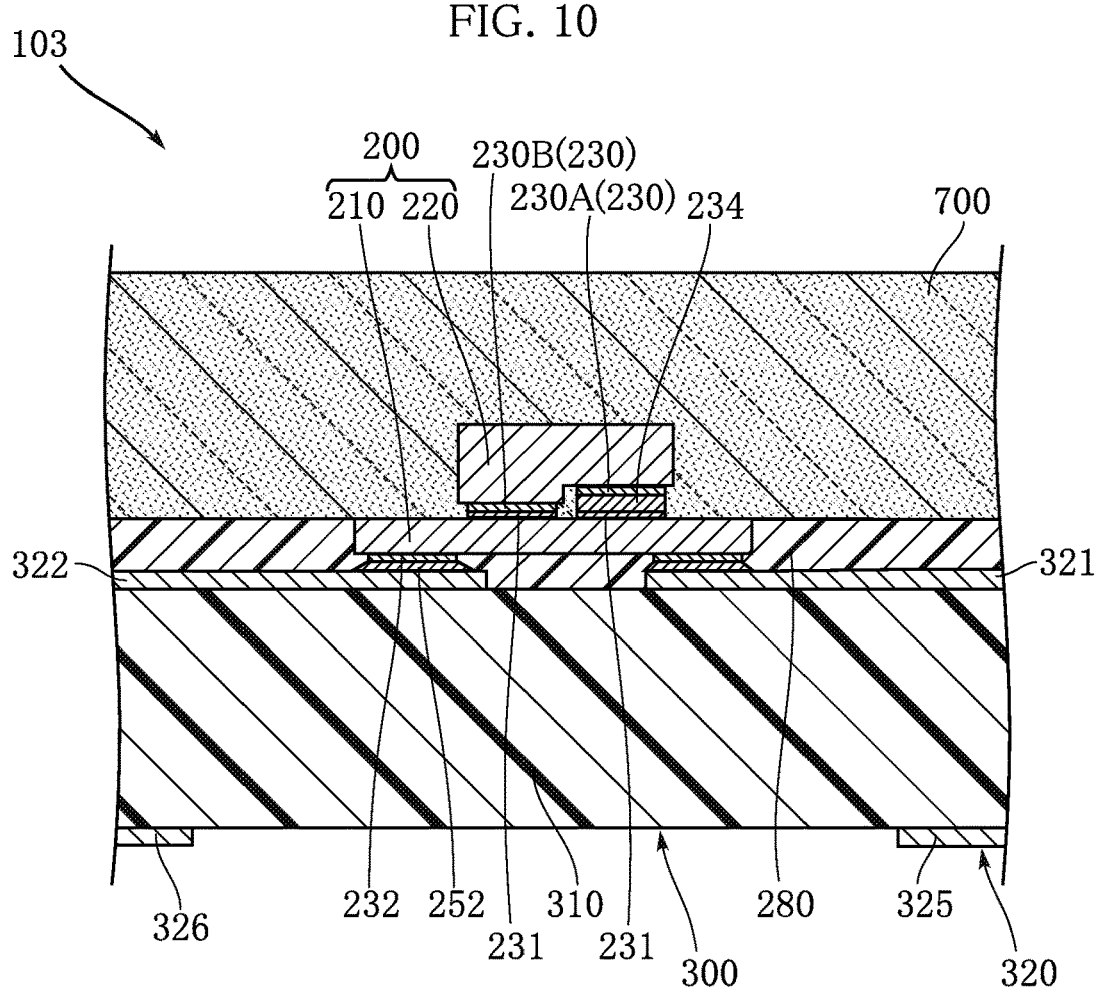
FIG. 10 is a schematic enlarged sectional view of the LED module shown in FIG. 8.

FIGS. 8-10 show an LED module according to a third embodiment of the present invention. The LED module 103 of this embodiment differs from the LED modules 101 and 102 in structure of the LED chip 200 and area where the white resin 280 is provided.

As shown in FIG. 10, in this embodiment, the sub-mount substrate 210 of the LED chip 200 has two electrode pads 232 on its lower surface. These electrode pads 232 are electrically connected to the two electrode pads 230 via conductive paths (not shown) formed in the sub-mount substrate 210. The electrode pads 232 are electrically connected to the bonding portions 321, 322 via conductive paste 252. The sub-mount substrate 210 having this structure is called a flip chip type.

As shown in FIGS. 8 and 9, the white resin 280 covers the entirety of the frame-shaped region extending from the sub-mount substrate 210 to the reflective surface 601 of the reflector 600.

This embodiment also assures enhancement of the brightness of the LED module 103. In particular, the region surrounded by the reflective surface 601 is covered with the white resin 280 except the region occupied by the LED chip 200. Thus, a larger amount of light from the LED chip 200 of the semiconductor layer 220 is reflected. This is desirable for enhancing the brightness of the LED module 103.

Figure 11:
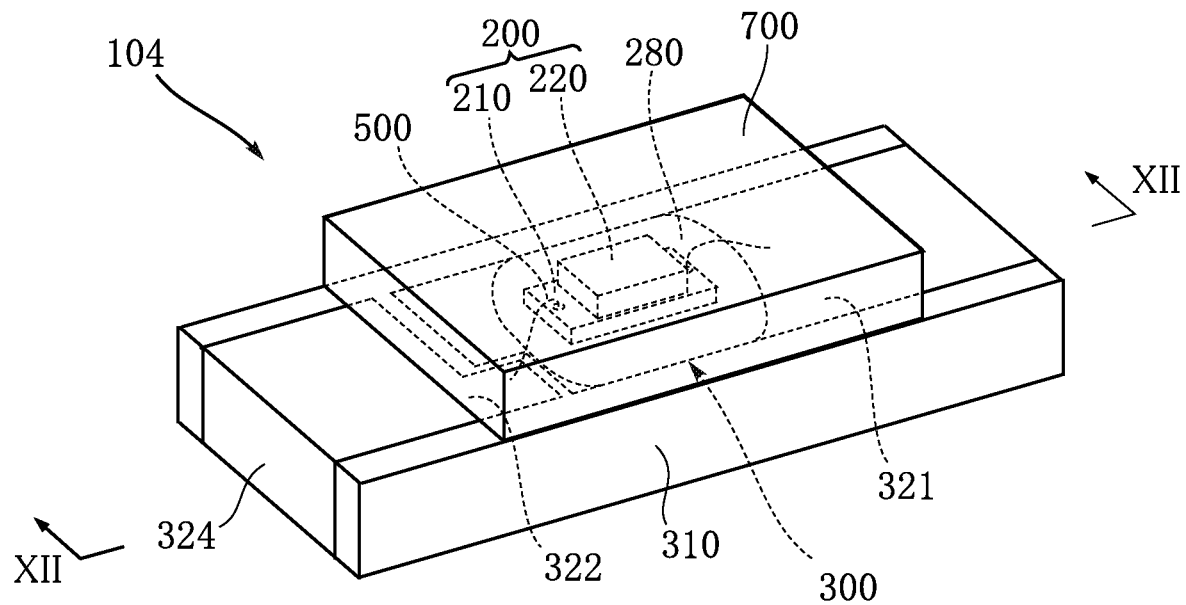
FIG. 11 is a perspective view of an LED module according to a fourth embodiment of the present invention.
Figure 12:
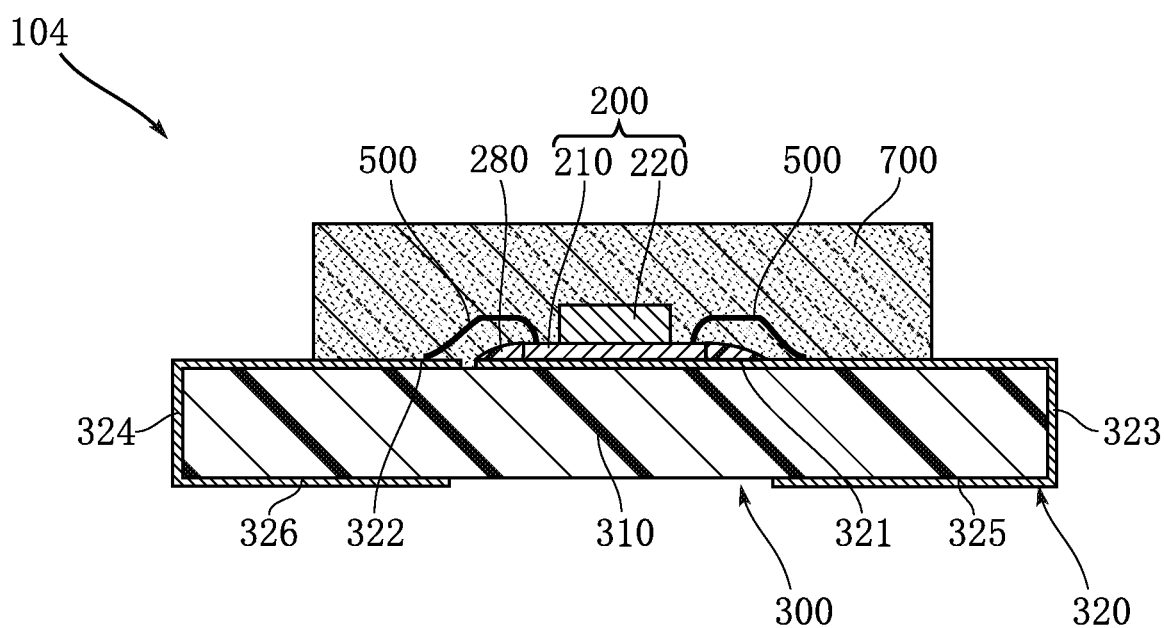
FIG. 12 is a sectional view taken along lines XII-XII in FIG. 11.

FIGS. 11 and 12 show an LED module according to a fourth embodiment of the present invention. The LED module 104 of this embodiment differs from the above-described LED modules 101, 102, 103 in that it does not include a reflector 600.

The sealing resin 700 is rectangular as viewed in plan and slightly smaller than the substrate 300. The sealing resin 700 covers the LED chip 200 and two wires 500.

This embodiment also assures enhancement of the brightness of the LED module 104. Moreover, light emitted from the LED chip 200 exits from the upper surface and side surfaces of the sealing resin 700. This increases the area illuminated by the LED module 104.

Figure 13:
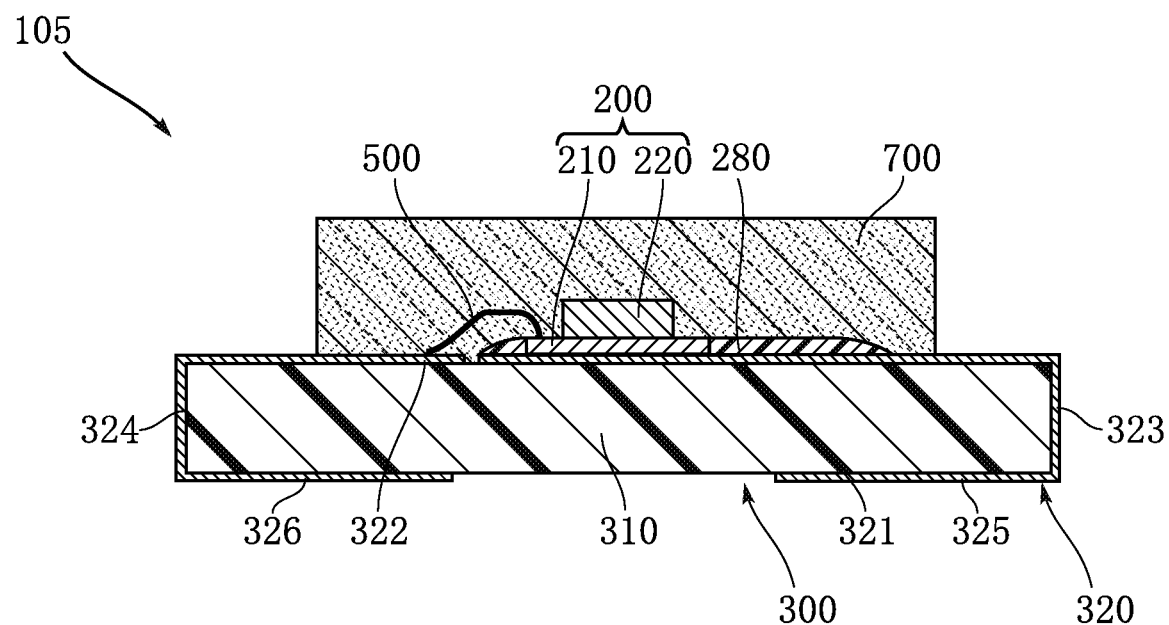
FIG. 13 is a sectional view showing an LED module according to a fifth embodiment of the present invention.

FIG. 13 shows an LED module according to a fifth embodiment of the present invention. The LED module 105 of this embodiment differs from the above-described LED module 104 in structure of the LED chip 200. In this embodiment, the sub-mount substrate 210 is configured as a single-wire type shown in FIG. 7. The right edge of the white resin 280 is close to the right edge of the sealing resin 700. This embodiment also assures enhancement of the brightness of the LED module 105.

Figure 14:
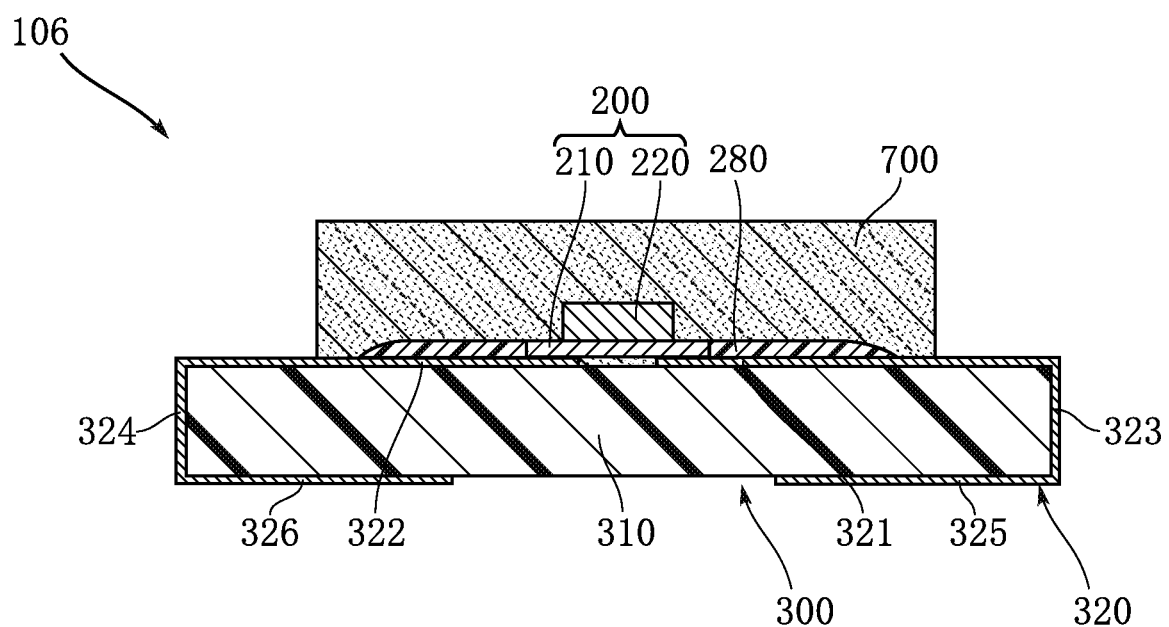
FIG. 14 is a sectional view showing an LED module according to a sixth embodiment of the present invention.

FIG. 14 shows an LED module according to a sixth embodiment of the present invention. The LED module 106 of this embodiment differs from the above-described LED modules 104, 105 in structure of the LED chip 200. In this embodiment, the sub-mount substrate 210 is configured as a flip-chip type shown in FIG. 10. Opposite edges of the white resin 280 are close to opposite edges of the sealing resin 700. This embodiment also assures enhancement of the brightness of the LED module 106.

Figure 15:
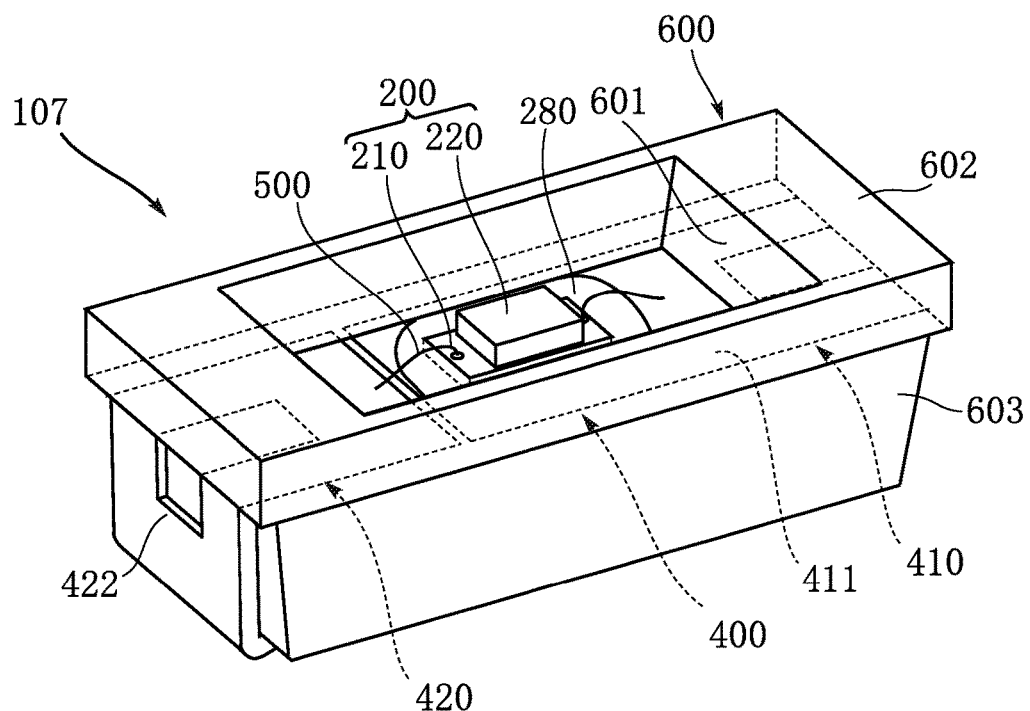
FIG. 15 is a perspective view of an LED module according to a seventh embodiment of the present invention.
Figure 16:
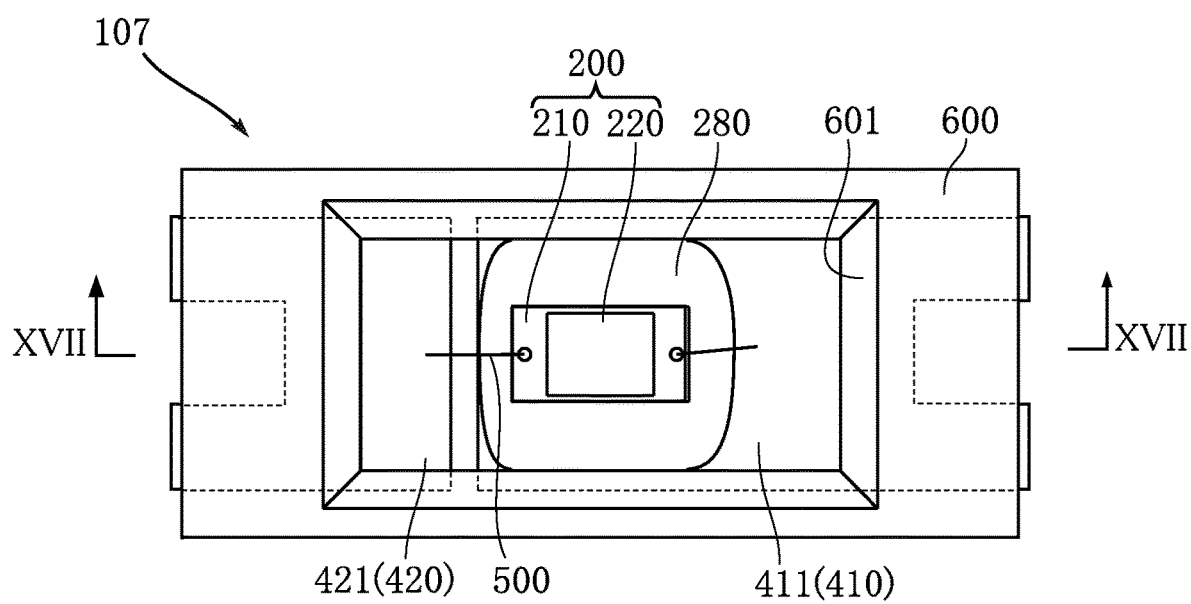
FIG. 16 is a plan view of the LED module shown in FIG. 15.
Figure 17:
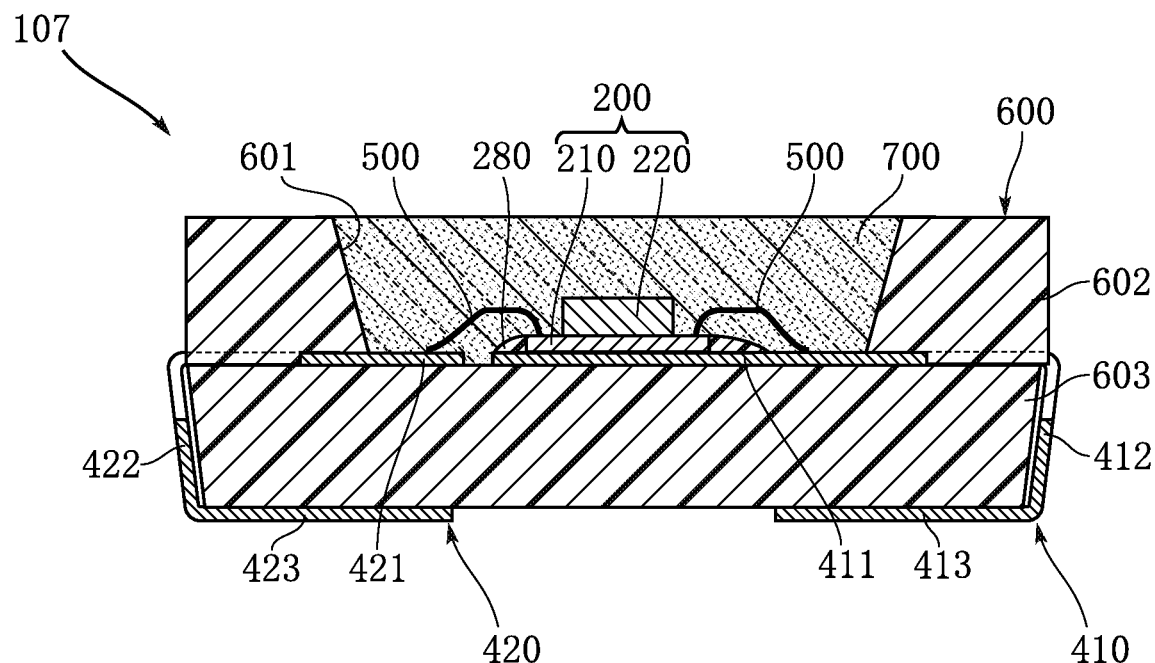
FIG. 17 is a sectional view taken along lines XVII-XVII in FIG. 16.

FIGS. 15-17 show an LED module according to a seventh embodiment of the present invention. The LED module 107 of this embodiment differs from the above-described LED modules 101-103 in that it includes leads 410, 420 and in structure of the reflector 600.

The leads 410, 420 are formed by performing punching or bending with respect to a plate made of e.g. Cu or Cu alloy. The lead 410 includes a bonding portion 411, a turn portion 412 and a mounting terminal 413. The lead 420 includes a bonding portion 421, a turn port ion 422 and amounting terminal 423. An LED chip 200 is bonded to the bonding portion 411. The bonding portion 411 and the mounting terminal 413 are generally parallel to each other and connected to each other via the turn portion 412. The bonding portion 421 and the mounting terminal 423 are generally parallel to each other and connected to each other via the turn portion 422. The LED chip 200 of this embodiment is configured as a two-wire type shown in FIG. 4. One of the two wires 500 is bonded to the bonding portion 411, whereas the other one is bonded to the bonding portion 421.

The reflector 600 includes a frame portion 602 and abase portion 603. The frame portion 602 has a reflective surface 601 and surrounds the LED chip 200. The base portion 603 is connected to the bottom of the frame portion 602 and held by the leads 410, 420.

This embodiment also assures enhancement of the brightness of the LED module 107. Leads 410 and 420, which are made of a metal plate, have excellent thermal conductivity. Thus, heat generated at the LED chip 200 is efficiently dissipated to the outside of the LED module 107.

Figure 18:
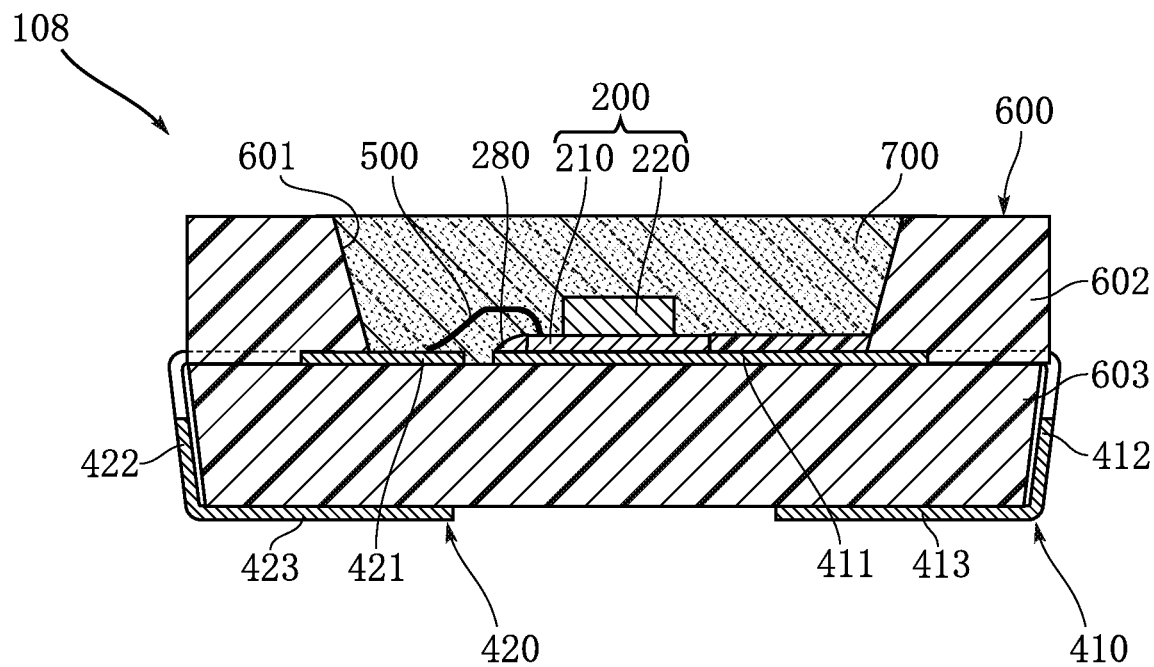
FIG. 18 is a sectional view of an LED module according to an eighth embodiment of the present invention.

FIG. 18 shows an LED module according to an eighth embodiment of the present invention. The LED module 108 of this embodiment differs from the above-described LED module 107 in structure of the sub-mount substrate 210. In this embodiment, the sub-mount substrate 210 is configured as a single-wire type shown in FIG. 7. The right edge of the white resin 280 reaches the reflective surface 601. This embodiment also assures enhancement of the brightness of the LED module 108. Since the white resin 280 has a larger area, brightness is further enhanced as compared with the LED module 107.

Figure 19:
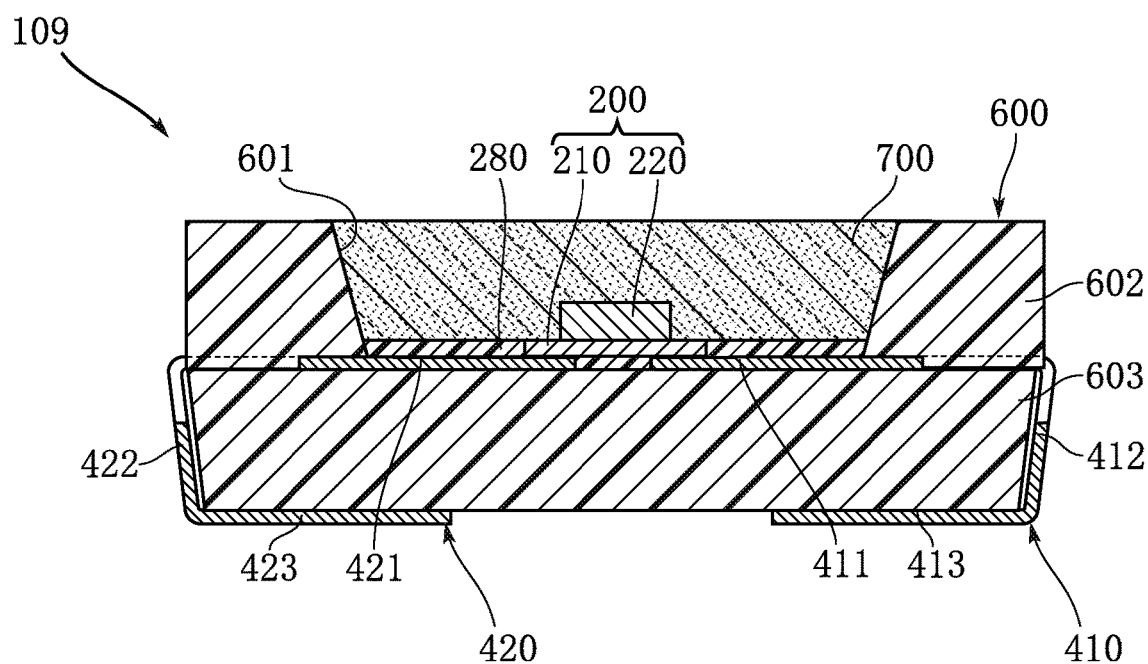
FIG. 19 is a sectional view of an LED module according to a ninth embodiment of the present invention.

FIG. 19 shows an LED module according to a ninth embodiment of the present invention. The LED module 109 of this embodiment differs from the above-described LED modules 107, 108 in structure of the sub-mount substrate 210. In this embodiment, the sub-mount substrate 210 is configured as a flip-chip type shown in FIG. 10. Opposite edges of the white resin 280 reach the reflective surface 601. This embodiment also assures enhancement of the brightness of the LED module 109. Since the white resin 280 has a larger area, brightness is further enhanced as compared with the LED module 108.

Figure 20:
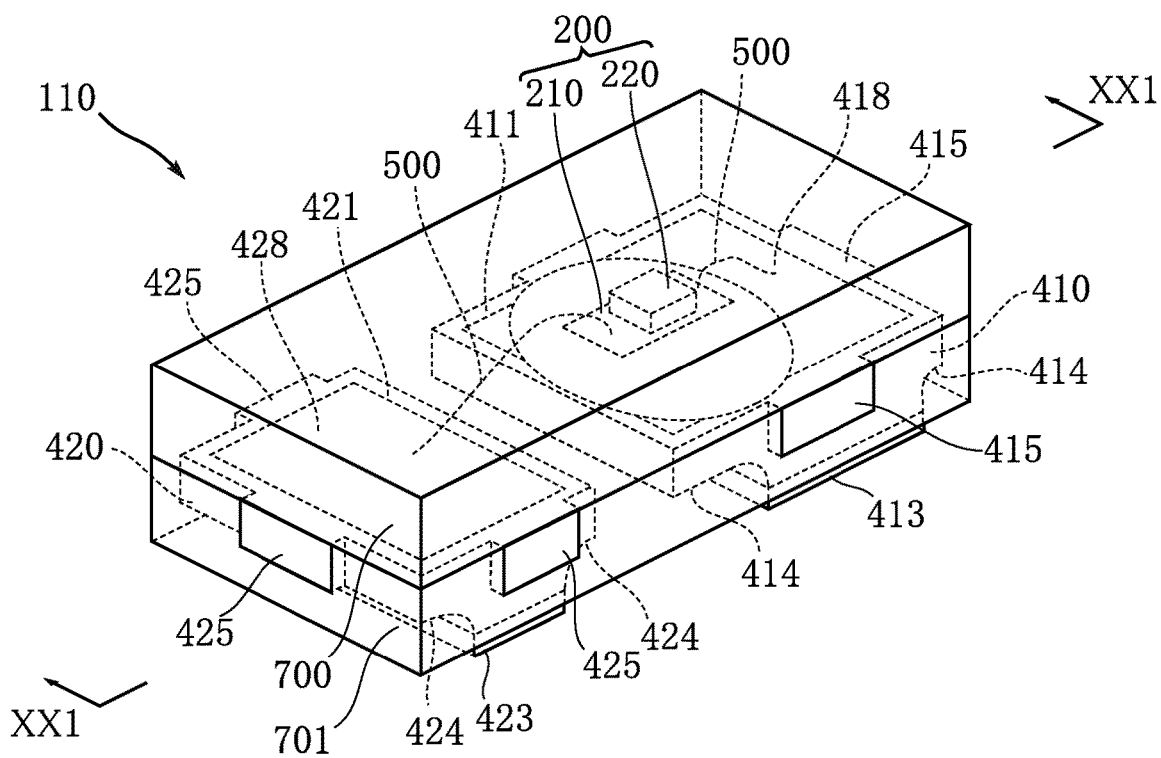
FIG. 20 is a perspective view of an LED module according to a tenth embodiment of the present invention.
Figure 21:
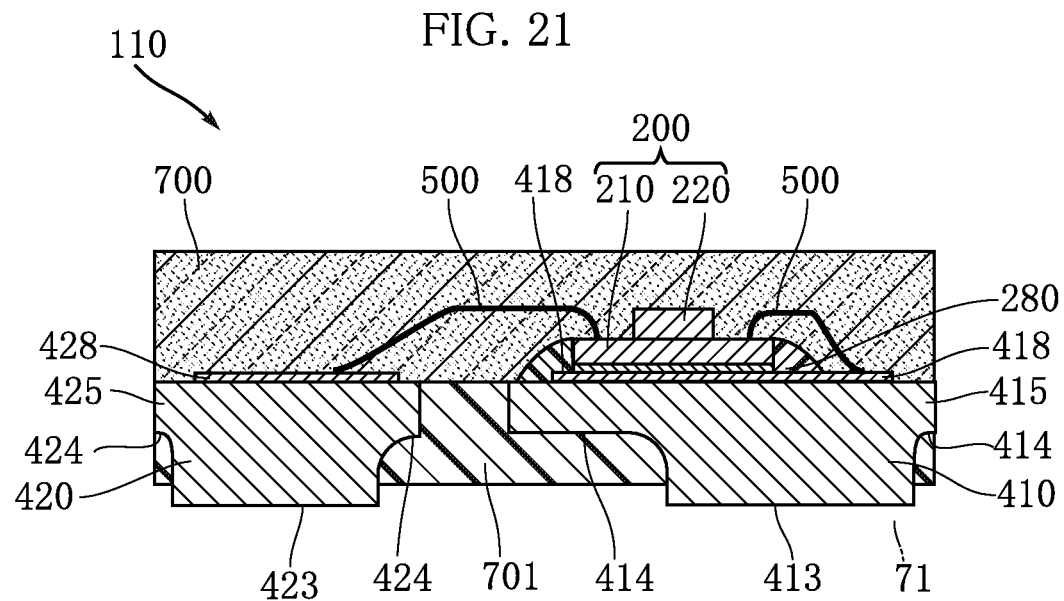
FIG. 21 is a sectional view taken along lines XXI-XXI in FIG. 20.

FIGS. 20 and 21 show an LED module according to a tenth embodiment of the present invention. The LED module 110 of this embodiment differs from the above-described LED modules 107-109 in structure of the leads 410, 420 and in that it includes a base resin and does not include a reflector 600.

In this embodiment, the lead 410 has a bonding portion 411, a mounting terminal 413, eaves 414 and extensions 415. The lead 420 includes a bonding portion 421, a mounting terminal 423, eaves 424 and extensions 425. Portions of the leads 410, 420 other than the bonding portions 411, 421 and the mounting terminals 413, 423 are mostly covered with the base resin 701. The base resin 701 is made of e.g. a white resin.

One of the eaves 414 extends from the bonding portion 411 toward the lead 420, whereas the other one extends away from the lead 420. One of the eaves 424 extends from the bonding portion 421 toward the lead 410, whereas the other one extends away from the lead 410. The eaves 414 and 424 are embedded in the base resin 701. The extensions 415 and 425 extend from the bonding portions 411 and 421, respectively, and the end surfaces of the extensions are exposed from the base resin 701.

On the bonding portions 411 and 421 are provided Ag layers 418 and 428. The obverse surfaces of the Ag layers 418 and 428 are relatively rough surfaces.

In plan view, the shape and size of the sealing resin 700 correspond to those of the base resin 701. The sealing resin covers the LED chip 200 and the wires 500.

This embodiment also assures enhancement of the brightness of the LED module 110. The leads 410, 420 promote heat dissipation from the LED chip 200. The provision of the eaves 414, 424 and extensions 415, 425 prevent leads 410, 420 from dropping from the base resin 701.

Figure 22:
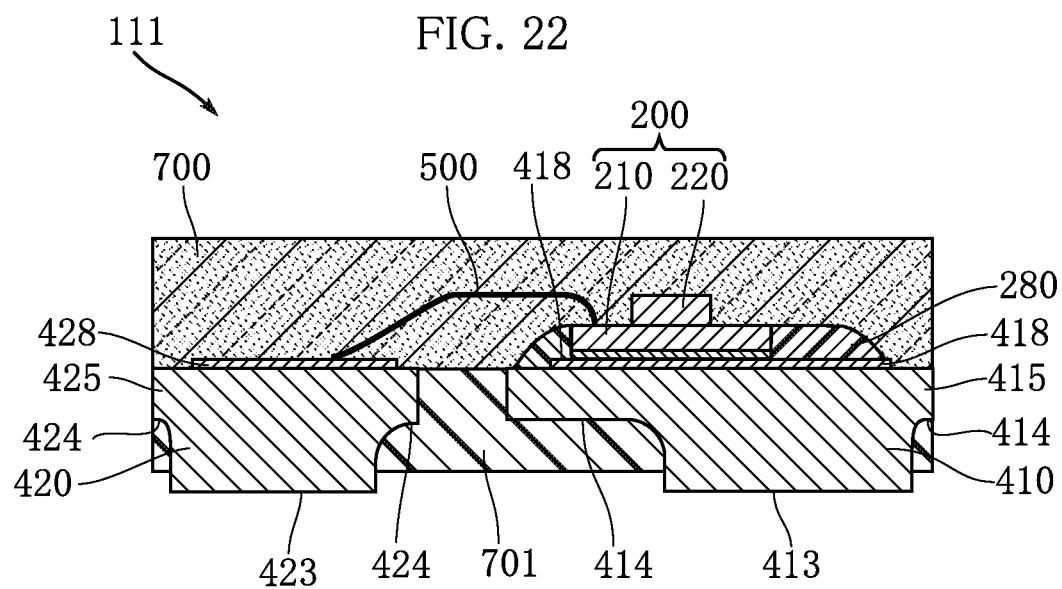
FIG. 22 is a sectional view of an LED module according to an eleventh embodiment of the present invention.

FIG. 22 shows an LED module according to an eleventh embodiment of the present invention. The LED module 111 of this embodiment differs from the above-described LED module 110 in structure of the sub-mount substrate 210. In this embodiment, the sub-mount substrate 210 is configured as a single-wire type shown in FIG. 7. The right edge of the white resin 280 is close to the right edge of the sealing resin 700. This embodiment also assures enhancement of the brightness of the LED module 111.

Figure 23:
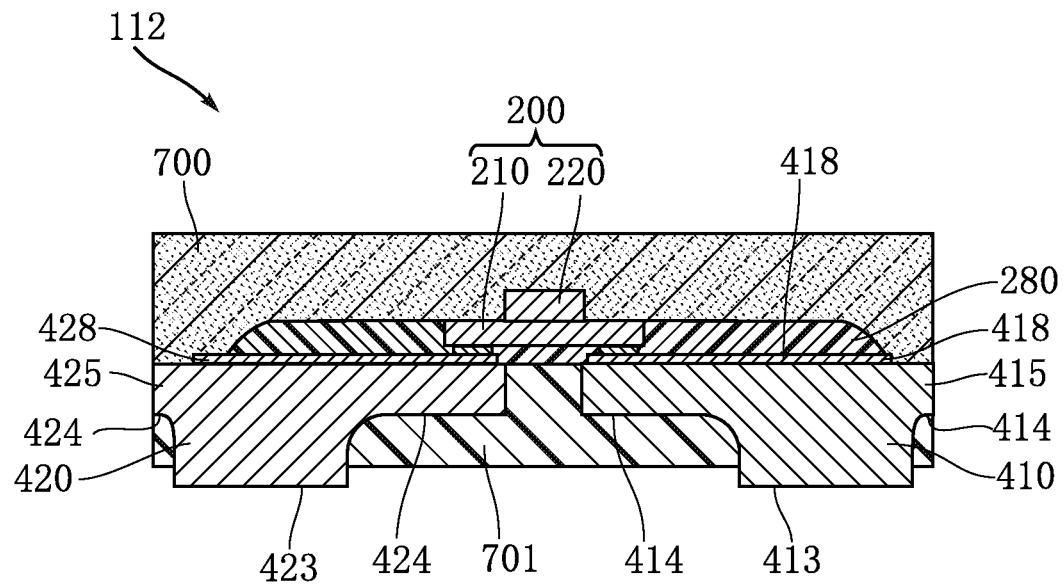
FIG. 23 is a sectional view of an LED module according to a twelfth embodiment of the present invention.

FIG. 23 shows an LED module according to a twelfth embodiment of the present invention. The LED module 112 of this embodiment differs from the above-described LED modules 110, 111 in structure of the sub-mount substrate 210. In this embodiment, the sub-mount substrate 210 is configured as a flip-chip type shown in FIG. 10. The opposite edges of the white resin 280 are close to the opposite edges of the sealing resin 700. This embodiment also assures enhancement of the brightness of the LED module 112.

FIGS. 24-27 show an LED module according to a thirteenth embodiment of the present invention. The LED module 113 of this embodiment differs from the above-described LED modules 101-112 in that it includes three LED chips 200, 201. The LED module 113 has leads 430, 431, 432, 433, 434, 435, three LED chips 200, 201, a reflector 600 and a resin package 600. For easier understanding, illustration of the sealing resin 700 is omitted in FIGS. 24 and 25.

The leads 430, 431, 432, 433, 434, 435 are made of e.g. Cu or Cu alloy, and each of these leads is partially covered with the reflector 600.

The two LED chips 200 are configured as a two-wire type shown in FIG. 7, and one of these LED chips emits blue light, whereas the other one emits green light. The LED chip 201 is an example of additional LED chip of the present invention and emits red light. The three LED chips 200, 201 are mounted in a row on the lead 430.

Figure 24:
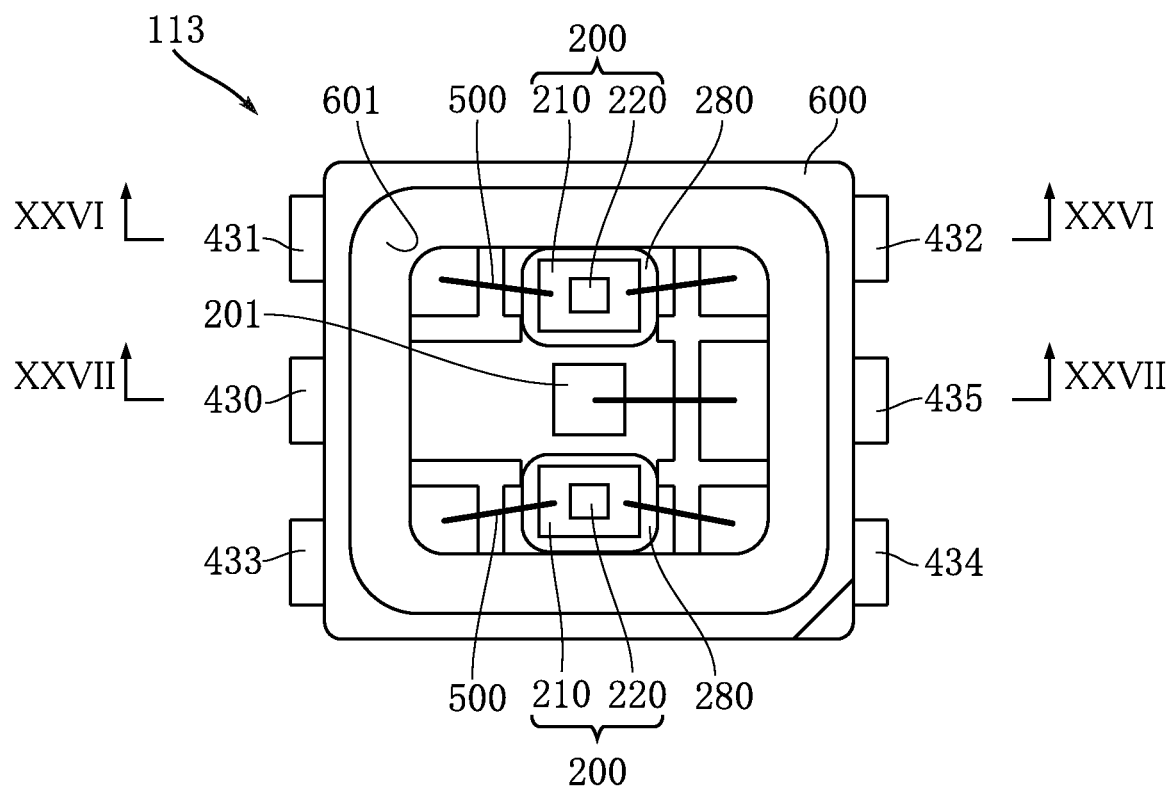
FIG. 24 is a plan view of an LED module according to a thirteenth embodiment of the present invention.
Figures 25, 26:
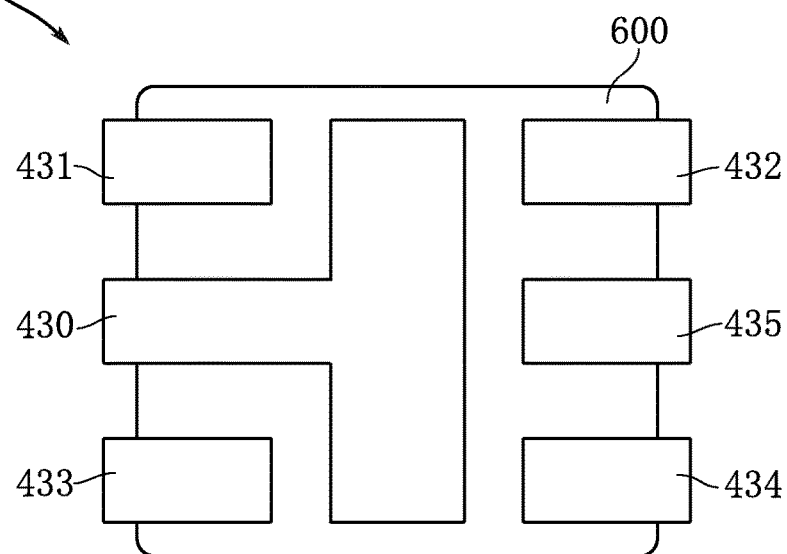
FIG. 25 is a bottom view of the LED module shown in FIG. 24.
FIG. 26 is a sectional view taken along lines XXVI-XXVI in FIG. 24.
Figure 27:
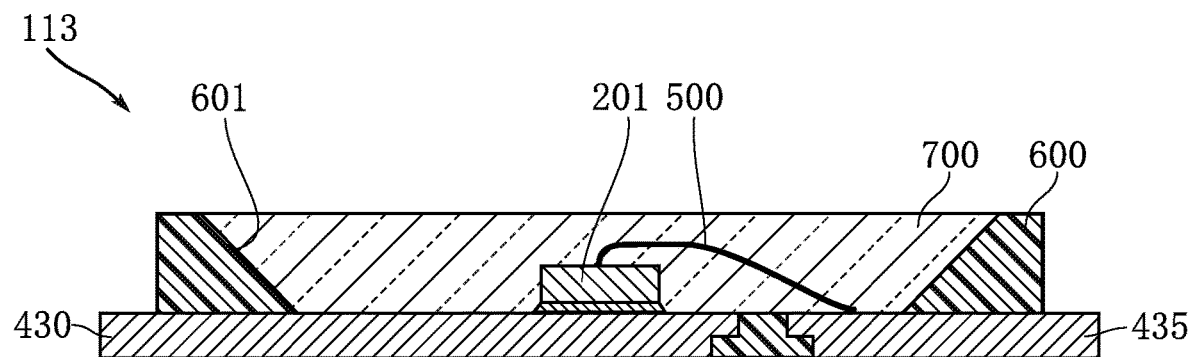
FIG. 27 is a sectional view taken along lines XXVII-XXVII in FIG. 24.

The two wires 500 bonded to the upper LED chip 200 in FIG. 24 are bonded to the leads 431, 432. The two wires 500 bonded to the lower LED chip 200 in FIG. 24 are bonded to the lead 433, 434.

The lower surface of the LED chip 201 is an electrode surface provided with an electrode. The LED chip 201 is bonded and electrically connected to the lead 430. To the upper surface of the LED chip 201 is bonded an end of a wire 500. The other end of this wire 500 is bonded to the lead 435.

White resin 280 is provided around each of the LED chips 200 and covers the side surfaces of each sub-mount substrate 210. The LED chip 201 is not covered with white resin 280.

The sealing resin 700 is made of e.g. a transparent epoxy resin. In this embodiment, the sealing resin 700 contains no fluorescent material.

This embodiment also assures enhancement of the brightness of the LED module 113. Moreover, white light can be emitted by mixing red light, green light and blue light from the three LED chips 200 and 201. Further, individually controlling the current application to each of the three LED chips 200, 201 allows light of various color tones to be emitted. The white resin 280 prevents light from being absorbed by the sub-mount substrates 210 without blocking the progress of the red light emitted from the LED chip 201.

Figure 28:
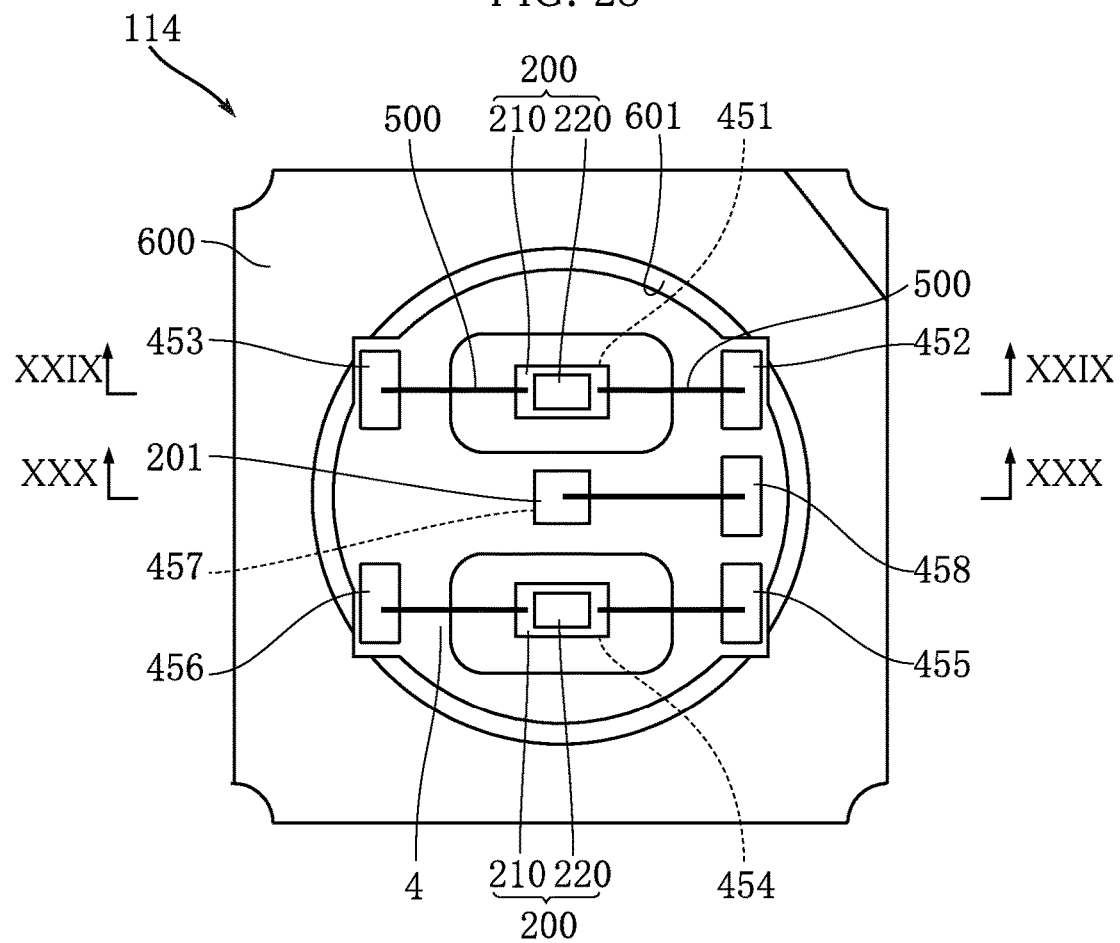
FIG. 28 is a plan view of an LED module according to a fourteenth embodiment of the present invention.
Figure 29:
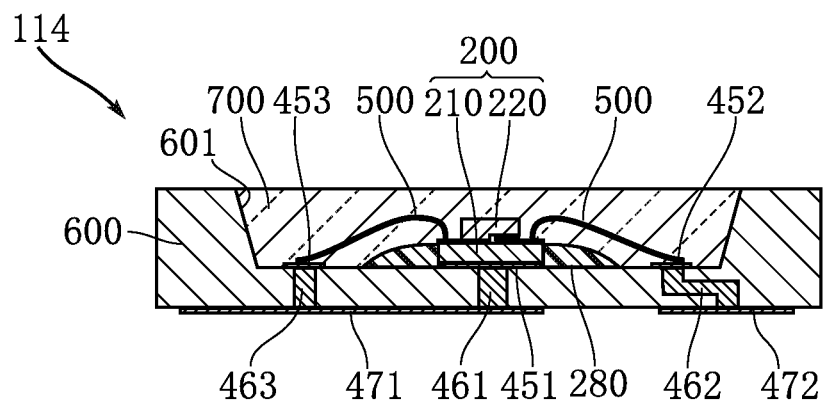
FIG. 29 is a sectional view taken along lines XXIX-XXIX in FIG. 28.
Figure 30:
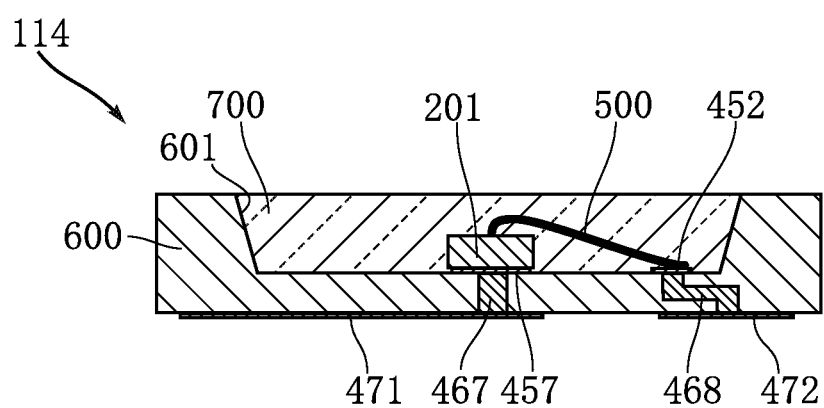
FIG. 30 is a sectional view taken along lines XXX-XXX in FIG. 28.

FIGS. 28-30 show an LED module according to a fourteenth embodiment of the present invention. The LED module 114 of this embodiment differs from the above-described LED module 113 in that the reflector 600 is provided with bonding pads 451, 452, 453, 454, 455, 456, 457, 458, through conductors 461, 462, 463, 464, 465, 466, 467, 468 (through conductors 464, 465, 466 are not shown), and mounting terminals 471, 472.

The bonding pads 451, 452, 453, 454, 455, 456, 457, 458 are made of e.g. Ag or Cu. Two LED chips 200 are mounted on the bonding pads 451, 454. Two wires 500 connected to one of the two LED chips 200 are bonded to the bonding pads 452, 453. Two wires connected to the other one of the LED chips 200 are bonded to the bonding pads 455, 456. An LED chip 201 is mounted on the bonding pad 457, and the wire 500 connected to the LED chip 201 is bonded to the bonding pad 458.

This embodiment also assures enhancement of the brightness of the LED module 114. Moreover, white light can be emitted by mixing red light, green light and blue light from the three LED chips 200 and 201.

Figure 31:
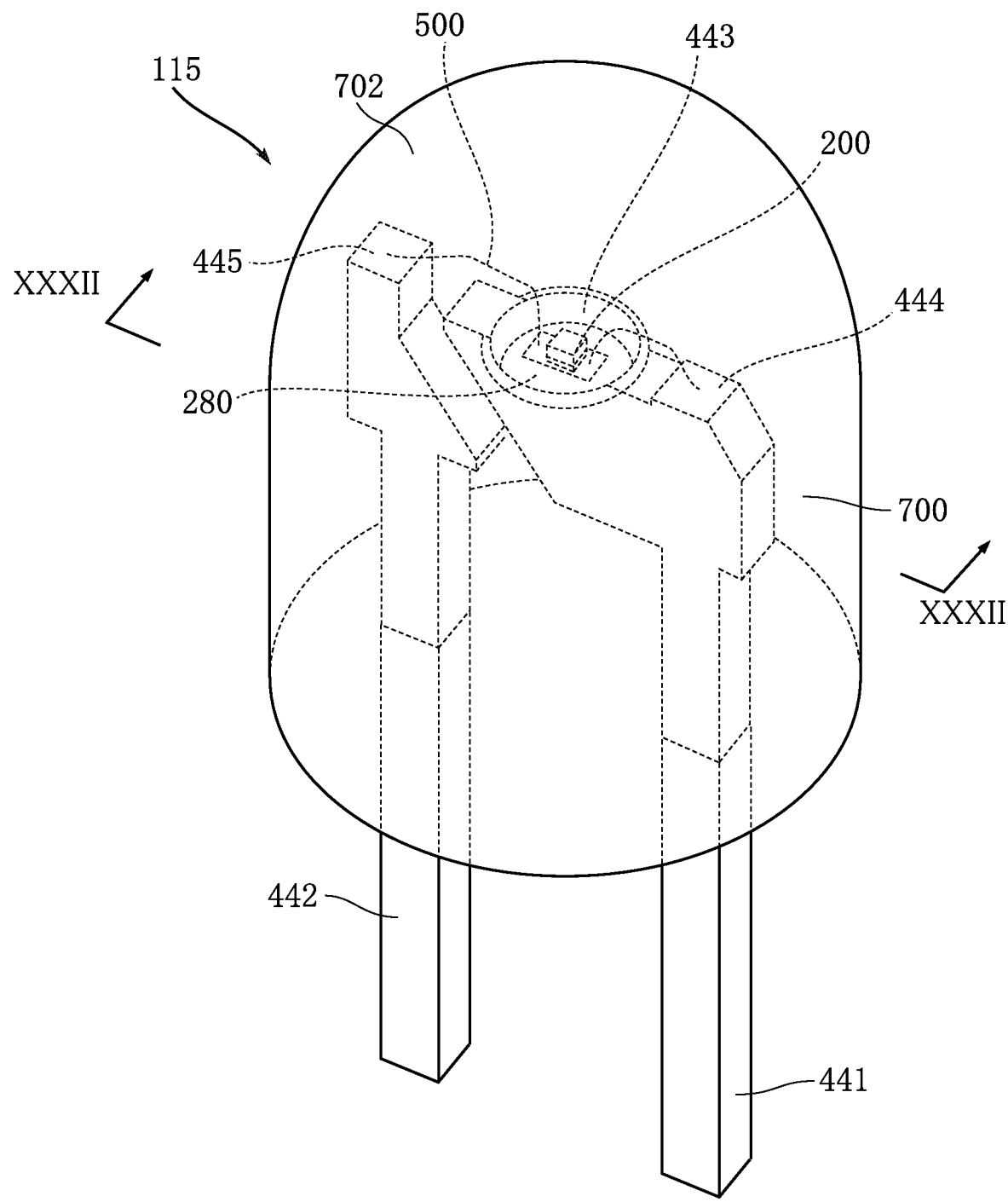
FIG. 31 is a perspective view of an LED module according to a fifteenth embodiment of the present invention.
Figure 32:
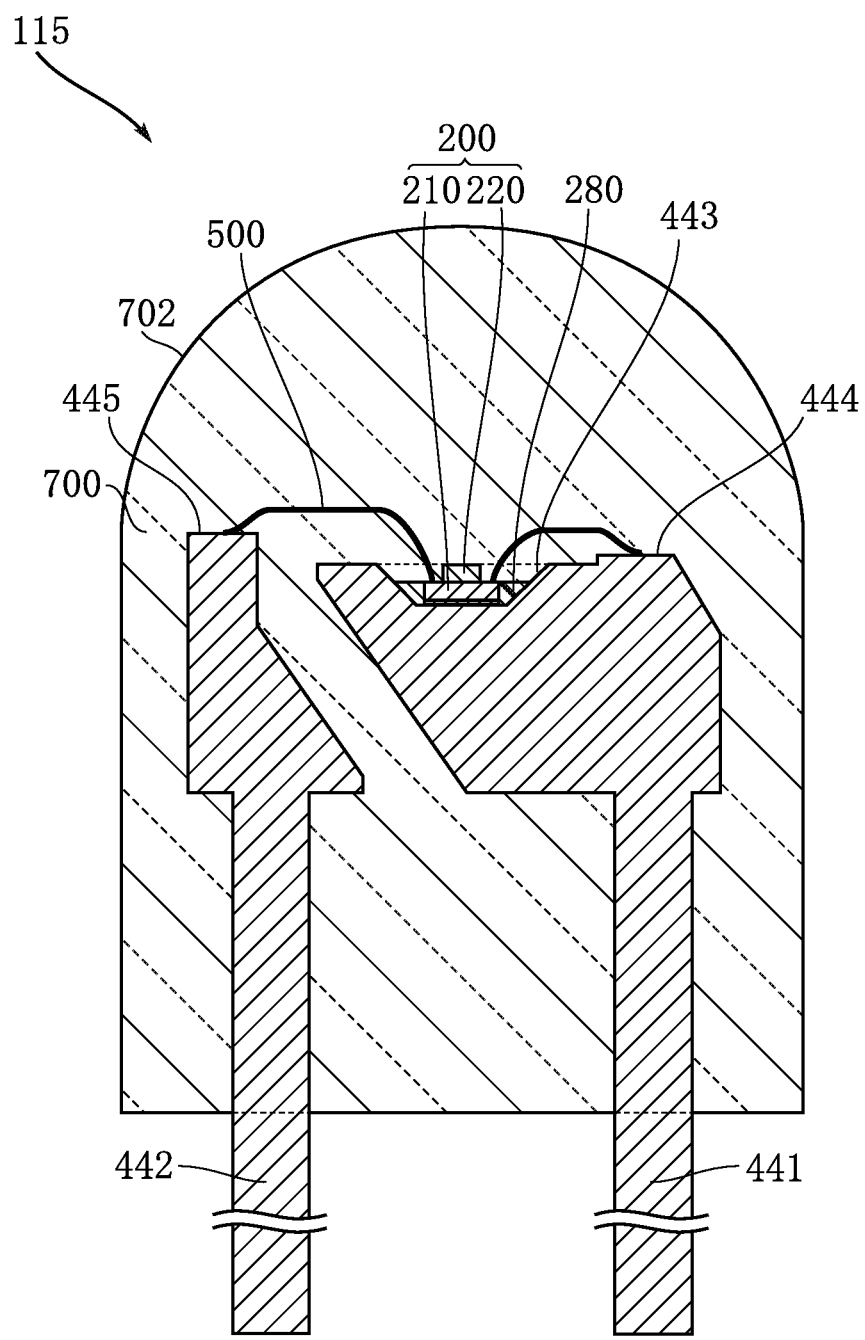
FIG. 32 is a sectional view taken along lines XXXII-XXXII in FIG. 31.
Figure 33:
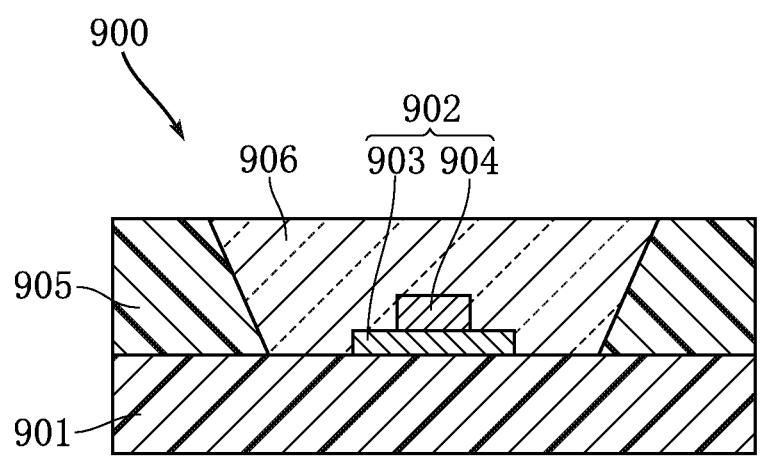
FIG. 33 is a sectional view showing an example of conventional LED module.

FIGS. 31 and 32 show an LED module according to a fifteenth embodiment of the present invention. The LED module 115 of this embodiment differs from the above-described LED modules 101-114 in that it includes two leads 441, 442, an LED chip 200 and a resin package 700 and is configured as a so-called bullet LED module.

The leads 441 and 442 are in the form of bars extending generally parallel to each other and partially project from the resin package 700. The projecting portions are used for mounting the LED module 115 to e.g. a circuit board.

The lead 441 has a cup 443 and a bonding portion 444. The cup 443 is provided adjacent to the top end of the lead 441, and the LED chip 200 is mounted on the bottom surface of the cup. Portions of the bottom surface which are not covered with the LED chip 200 are covered with white resin 280. The bonding portion 444 is provided adjacent to the cup 443. One of the two wires connected to the LED chip 200 is bonded to this bonding portion.

The lead 442 has a bonding portion 445 at the top end. The other one of the two wires connected to the LED chip 200 is bonded to this bonding portion.

The sealing resin 700 covers the LED chip 200 and part of each lead 441, 442 and includes a columnar portion and a dome-shaped portion. The dome-shaped portion provides a lens 702. The lens 702 enhances directivity of the light from the LED chip 200.

This embodiment also assures enhancement of the brightness of the LED module 115.

The LED module according to the present invention is not limited to the foregoing embodiments. The specific structure of each part of the LED module according to the present invention can be varied in design in many ways.

The invention claimed is:

1. An LED module comprising:
a first electrical conductor including a first surface and a second surface that face opposite to each other;
a light emitter mounted on the first electrical conductor and including a substrate and a light-emitting layer;
a first resin disposed on the first electrical conductor so as to surround the light emitter as viewed in a first direction perpendicular to the first surface; and
a second resin covering the light emitter and the first resin,
wherein the first electrical conductor includes a main body and protrusion that is smaller in thickness than the main body,
the protrusion includes a curved surface,
the light emitter is disposed at a position overlapping with the curved surface as viewed in the first direction, and
the first resin includes a curved upper surface with which the second resin is held in contact.

2. The LED module according to claim 1, wherein the light emitter is greater in thickness than the protrusion.

3. The LED module according to claim 1, wherein the substrate includes a side surface, and the first resin is held in contact with the side surface.

4. The LED module according to claim 1, wherein the first resin includes a curved portion.

5. The LED module according to claim 1, wherein the second resin is greater in light transmissibility than the first resin.

6. The LED module according to claim 1, wherein the light emitter includes an upper surface, and the second resin covers an entirety of the upper surface.

7. The LED module according to claim 1, wherein the main body and the protrusion include upper surfaces, respectively, that are flush with each other.

8. The LED module according to claim 1, wherein the second resin is greater in thickness than the light emitter.

9. The LED module according to claim 1, wherein the first resin includes a portion disposed on the protrusion and another portion disposed on the main body.

10. The LED module according to claim 1, wherein the second resin includes a portion that does not overlap with the first electrical conductor as viewed in the first direction.

11. The LED module according to claim 1, wherein the curved upper surface is connected to an upper surface of the light emitter.

12. The LED module according to claim 1, wherein the second resin includes a first portion and a second portion different from the first portion, the first portion overlapping with the light emitter as viewed in the first direction and being smaller in thickness than the second portion.

13. The LED module according to claim 12, wherein the second portion overlaps with the main body as viewed in the first direction.

14. The LED module according to claim 1, wherein the light emitter is supported by the first surface of the first electrical conductor, and the first resin includes a portion held in contact with the first surface of the first electrical conductor.

15. The LED module according to claim 1, further comprising a second electrical conductor spaced apart from the first electrical conductor and electrically connected to the light emitter.

16. The LED module according to claim 15, wherein the second electrical conductor includes a protrusion extending toward the protrusion of the first electrical conductor.

17. The LED module according to claim 16, wherein the protrusion of the first electrical conductor and the protrusion of the second electrical conductor face to each other via an intervening resin having a same color as that of the first resin.

18. The LED module according to claim 16, wherein the protrusion of the second electrical conductor overlaps with the second resin as viewed in the first direction.

19. The LED module according to claim 16, wherein a distance between the protrusion of the first electrical conductor and the protrusion of the second electrical conductor in a second direction perpendicular to the first direction is smaller than a size of the light emitter in the second direction.

20. An LED module comprising:
a first electrical conductor including a first surface and a second surface that face opposite to each other;
a light emitter mounted on the first electrical conductor and including a substrate and a light-emitting layer;
a first resin disposed on the first electrical conductor so as to surround the light emitter as viewed in a first direction perpendicular to the first surface; and
a second resin covering the light emitter and the first resin,
wherein the first electrical conductor includes a main body and protrusion that is smaller in thickness than the main body,
the protrusion includes a curved surface,
the light emitter is disposed at a position overlapping with the curved surface as viewed in the first direction,
the second resin includes a first portion and a second portion different from the first portion, the first portion overlapping with the light emitter as viewed in the first direction and being smaller in thickness than the second portion, and
the second portion overlaps with the main body as viewed in the first direction.

* * * * *